United States Patent [19]
Furuyama

[11] Patent Number: 5,444,652
[45] Date of Patent: Aug. 22, 1995

[54] SEMICONDUCTOR MEMORY DEVICE HAVING A MEMORY CELL UNIT INCLUDING A PLURALITY OF TRANSISTORS CONNECTED IN SERIES

[75] Inventor: Tohru Furuyama, Tokyo, Japan

[73] Assignee: Kabushiki Kaisha Toshiba, Kawasaki, Japan

[21] Appl. No.: 191,301

[22] Filed: Feb. 3, 1994

Related U.S. Application Data

[63] Continuation of Ser. No. 833,124, Feb. 10, 1992, abandoned.

[30] Foreign Application Priority Data

Feb. 13, 1991 [JP] Japan ................................ 3-041315

[51] Int. Cl.[6] ............................................. G11C 11/24
[52] U.S. Cl. ................................. 365/149; 365/189.05
[58] Field of Search ............... 365/149, 205, 190, 202, 365/189.05, 102

[56] References Cited

U.S. PATENT DOCUMENTS

| | | | |
|---|---|---|---|
| 3,763,480 | 10/1973 | Weimer | 340/173 R |
| 4,070,590 | 1/1978 | Ieda | 307/355 |
| 4,225,945 | 9/1980 | Kuo | 365/149 |
| 4,593,382 | 6/1986 | Fujishima | 365/149 |
| 4,648,073 | 3/1987 | Kenney | 365/149 |
| 4,669,063 | 5/1987 | Kirsch | 365/189 |
| 4,758,987 | 7/1988 | Sakui | 365/189 |
| 4,903,242 | 2/1990 | Hamaguchi et al. | 365/230.08 |
| 4,943,944 | 7/1990 | Sakui et al. | 365/189.05 |
| 4,954,994 | 9/1990 | Hashimoto | 365/230.06 |
| 4,980,863 | 12/1990 | Ogihara | 365/205 |
| 5,005,158 | 4/1991 | McClure et al. | 365/200 |
| 5,018,110 | 5/1991 | Sugiyama et al. | 365/230.09 |
| 5,025,294 | 6/1991 | Ema | 357/23.6 |
| 5,051,954 | 9/1991 | Toda et al. | 365/189.02 |
| 5,079,746 | 1/1992 | Sato | 365/225.7 |
| 5,091,761 | 2/1992 | Hiraiwa | 357/23.6 |
| 5,091,885 | 2/1992 | Ohsawa | 365/203 |
| 5,172,198 | 12/1992 | Aritome | 257/315 |
| 5,184,326 | 2/1993 | Hoffman | 365/201 |

FOREIGN PATENT DOCUMENTS

| | | |
|---|---|---|
| 0157051 | 10/1985 | European Pat. Off. |
| 0273639 | 7/1988 | European Pat. Off. |
| 0365720 | 5/1990 | European Pat. Off. |
| 0398244 | 8/1992 | European Pat. Off. |
| 0499224 | 8/1992 | European Pat. Off. |
| 1922761 | 4/1976 | Germany. |
| 4015472 | 11/1990 | Germany. |
| 1-134796 | 5/1989 | Japan. |
| 3-58377 | 3/1991 | Japan. |
| 3-69092 | 3/1991 | Japan. |
| 4-212780 | 8/1992 | Japan. |

OTHER PUBLICATIONS

Shah et al., "A 4Mb DRAM with Cross-point Trench Transistor Cell", 1986 ISSCC Digest of Technical Papers, pp. 268-269.

Ema et al., "3-Dimensional Stacked Capacitor Cell for 16M and 64M DRAMs", 1988 IEDM Technical Digest, pp. 592-595.

(List continued on next page.)

Primary Examiner—Joseph A. Popek
Assistant Examiner—A. Zarabian
Attorney, Agent, or Firm—Banner & Allegretti, Ltd.

[57] ABSTRACT

A semiconductor memory device includes a memory cell array having a plurality of dynamic memory cells each of which has a plurality of cascade-connected MOS transistors and data storing capacitors each connected at one end to one end of a corresponding one of the MOS transistors, registers each provided for a corresponding one of columns of the memory cell array, for temporarily storing data time-sequentially read out from the memory cell; and switching elements for controlling the respective registers to be accessed independently from the memory cell array.

6 Claims, 21 Drawing Sheets

OTHER PUBLICATIONS

Fujishima et al., "A Storage-Node-Boosted RAM with Word-Line Delay Compensation", IEEE Journal of Solid State Circuits, vol. SC-17, No. 5, pp. 872-875, Oct. 1982.

Ohta et al., "A Novel Memory Cell Architecture for High-Density DRAMs", 1989 Symposium of VLSI Circuits, Digest of Tech. Papers, pp. 101-102.

Kimura, et al., "A Block-Oriented RAM with Half-Sized DRAM Cell and Quasi-Folded Data-Line Architecutre," ISSCC 91, pp. 106-107, Feb. 14, 1991.

Arimoto et al., "A Circuit Design of Intelligent CDRAM with Automatic Write Back Capability", 1990 Symposium on VLSI Circuits, Digest of Technical Papers, pp. 79-80.

Watanabe et al., "Stacked Capacitor Cells for High-density dynamic RAMs", 1988 IEDM Technical Digest, pp. 600-603.

Asakura et al., "Cell-Plate Line Connecting Complementary Bitline (C3) Architecture for Battery Operating DRAMs", 1991 Symposium on VLSI Circuits, May 30, 1991, pp. 59-60.

Kimura et al., "A Block-Oriented RAM with Half-Sized DRAM Cell and Quasi-Folded Data-line Architecture", ISCC 91, Slide Supplement, pp. 70-71.

Ohta et al., "Quadruply Self-Aligned Stacked High-Capacitance RAM Using $Ta_2O_5$ High Density VLSI Dynamic Memory", IEEE Transactions on Electron Devices, vol. ED-29, No. 3, Mar. 1982, pp. 368-376.

Sunouchi et al., "A Surrounding Gate Transistor (SGT) Cell for 64/256 MBit DRAMS", 1989 IEDM Technical Digest, pp. 23-26.

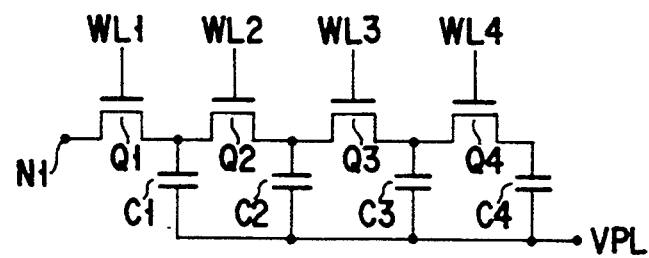
F I G. 1
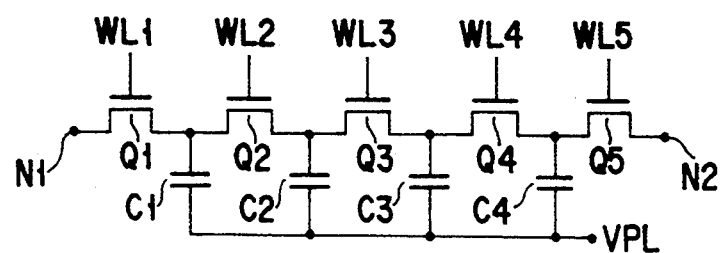
F I G. 2

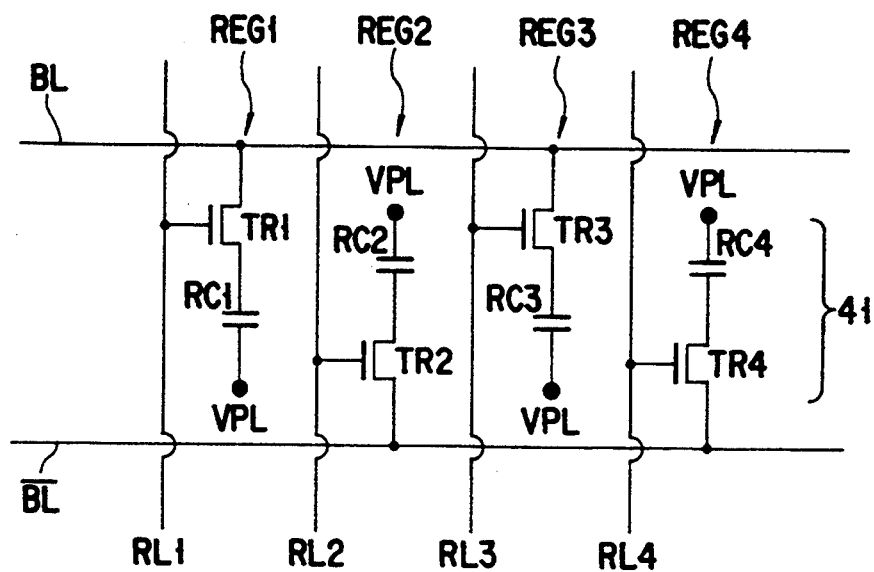
F I G. 5
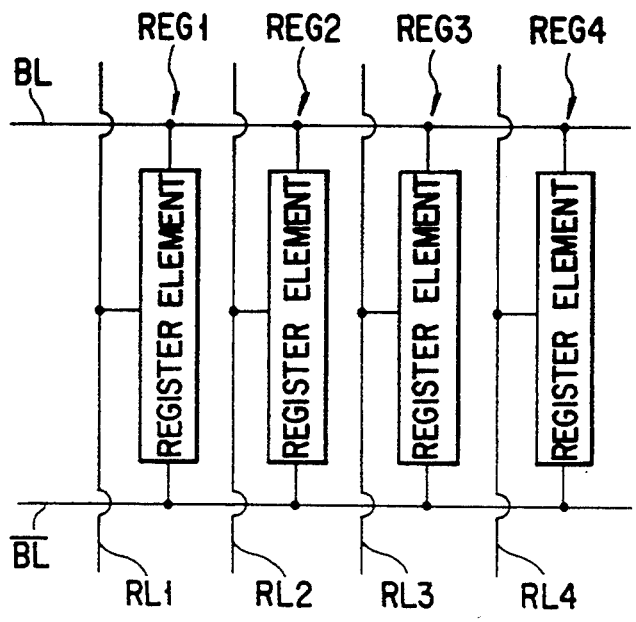
F I G. 6

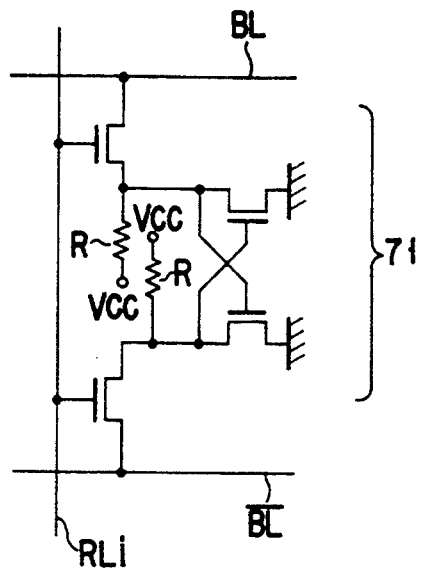
F I G. 7A
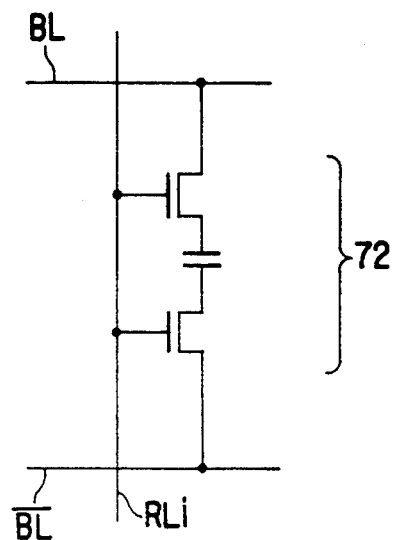
F I G. 7B

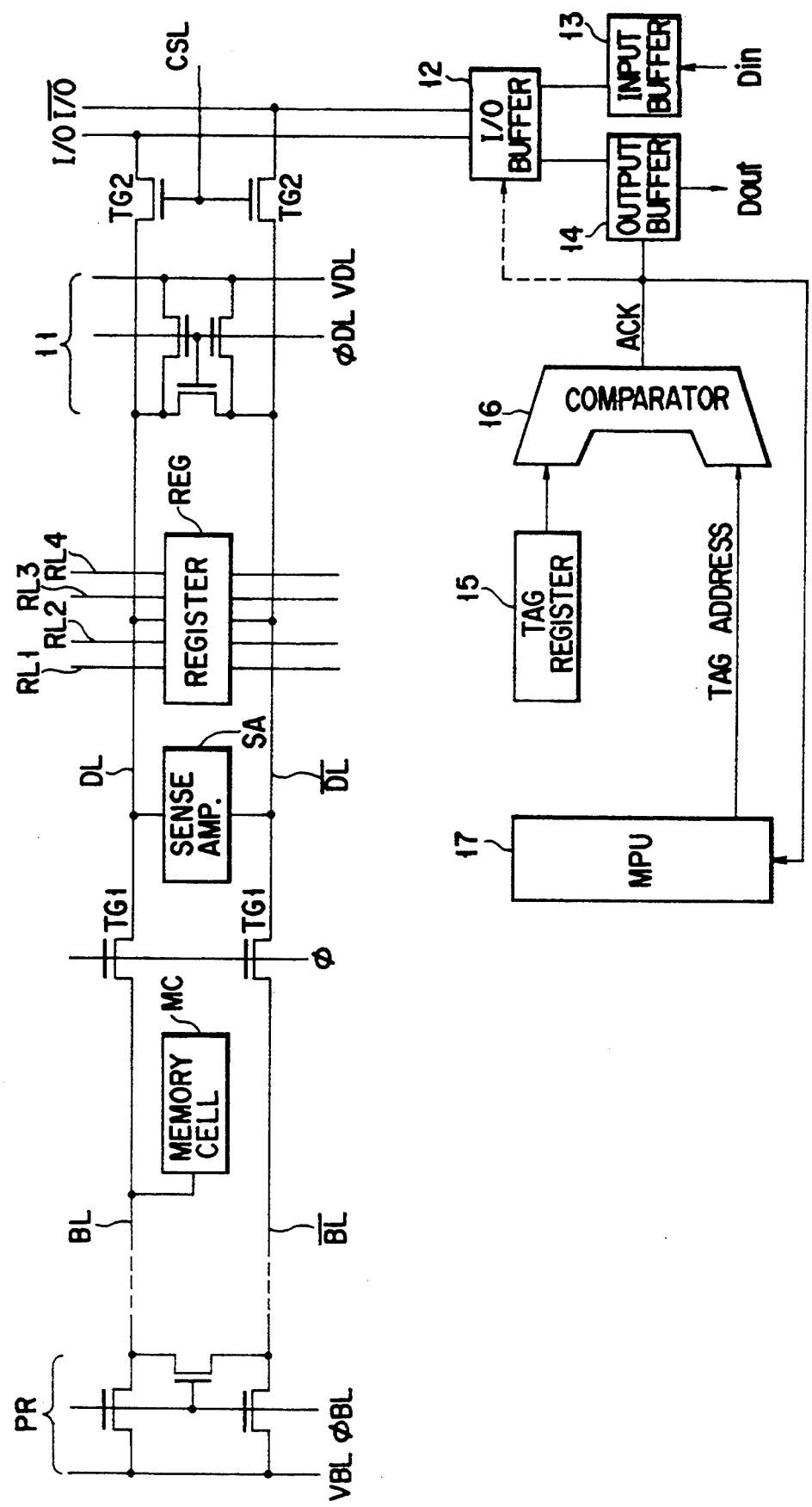
F I G. 12

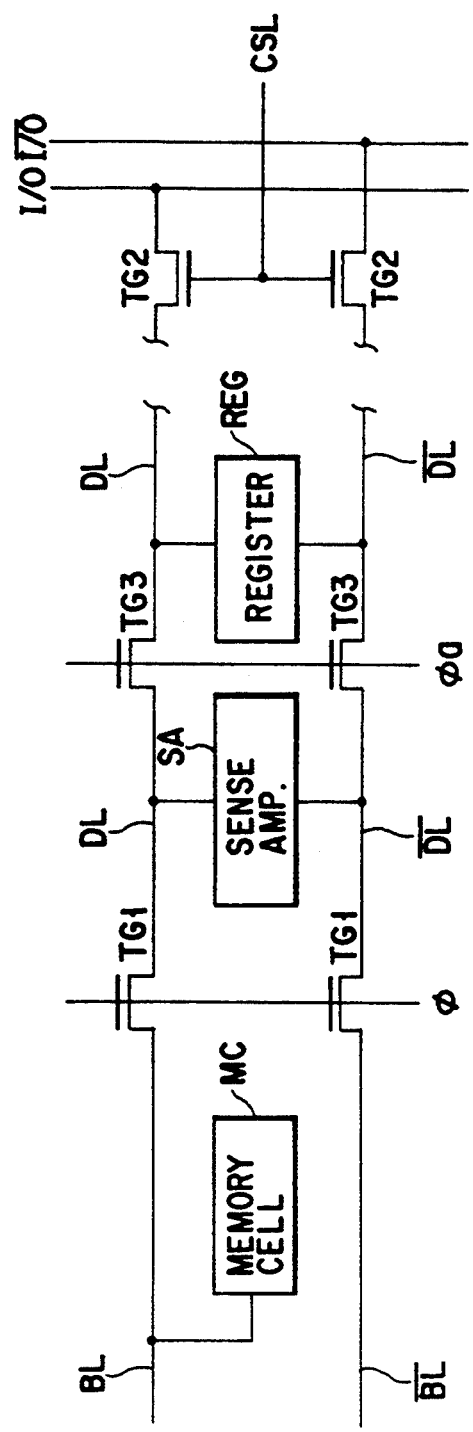
F I G. 16

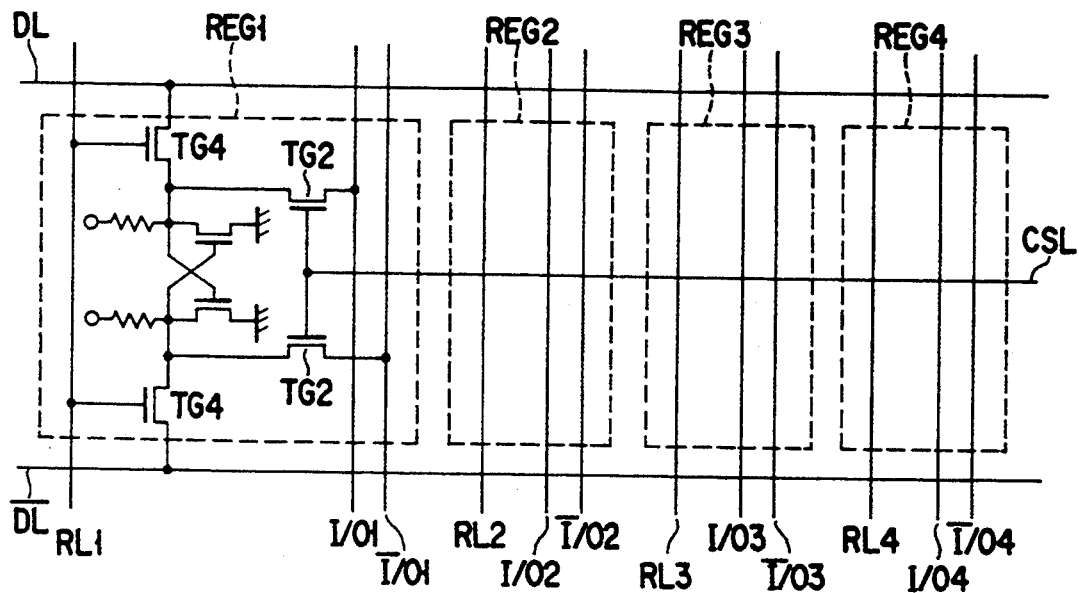
F I G. 18
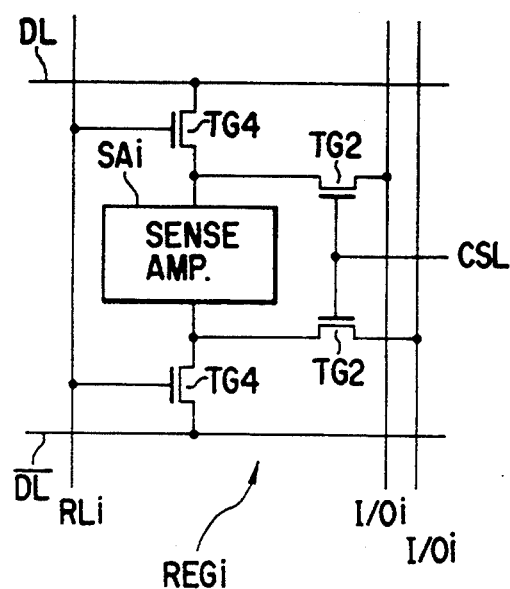
F I G. 19

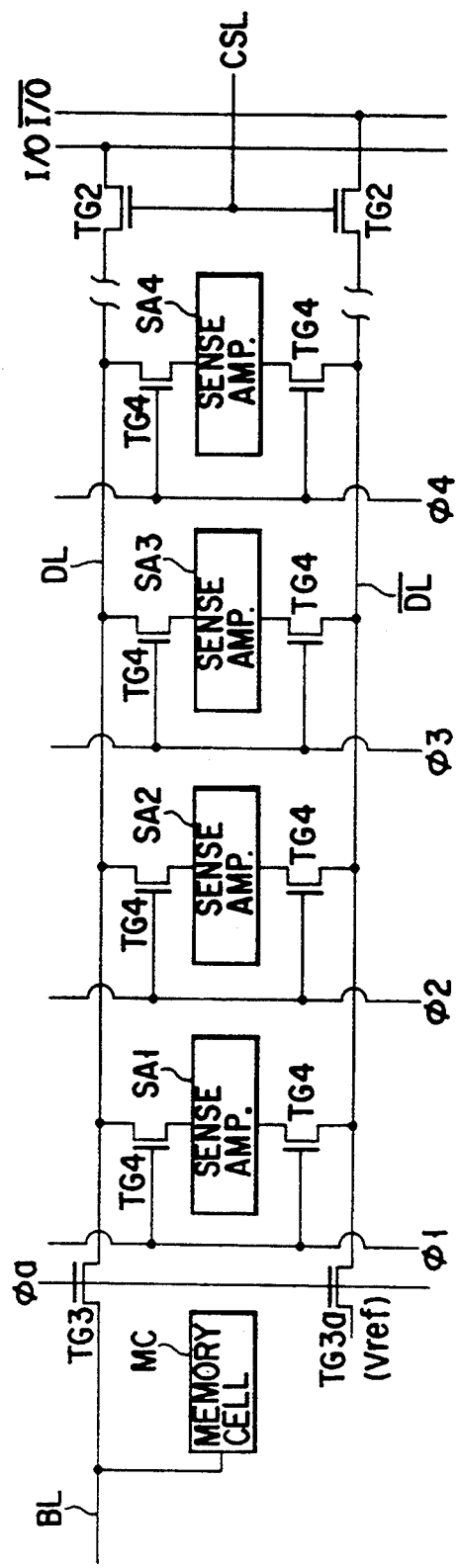
F I G. 25

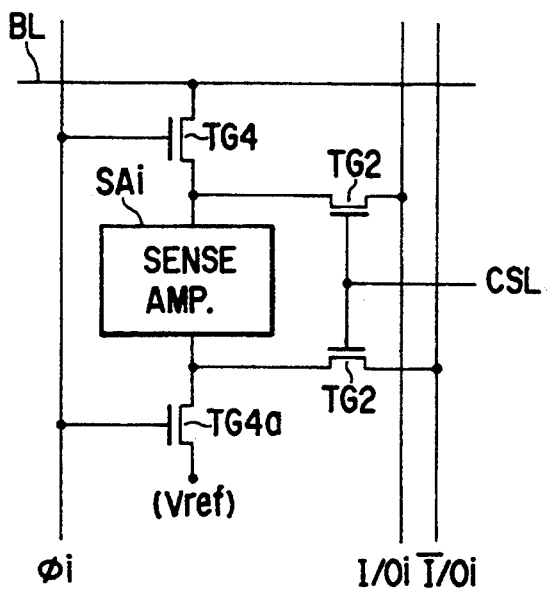
F I G. 26
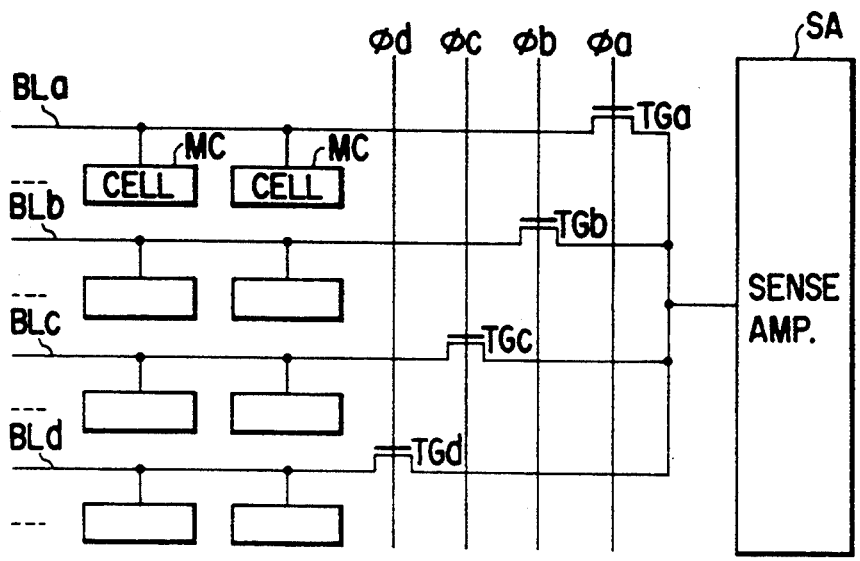
F I G. 27

SEMICONDUCTOR MEMORY DEVICE HAVING A MEMORY CELL UNIT INCLUDING A PLURALITY OF TRANSISTORS CONNECTED IN SERIES

This application is a continuation of application Ser. No. 07/833,124, filed Feb. 10, 1992, now abandoned.

BACKGROUND OF THE INVENTION

1. Field of the Invention

This invention relates to a semiconductor memory device, and more particularly to a dynamic random access memory (DRAM) having an array of dynamic memory cells including a plurality of cascade-connected MOS transistors and data storing capacitors which are each connected at one end to one end of a corresponding one of the MOS transistors.

2. Description of the Related Art

A DRAM cell which is now practically used is constructed by one transfer gate MOS (insulated-gate) transistor connected to a word line and a bit line and one data storing capacitor connected to the MOS transistor.

In order to increase the integration density of the DRAM cells and lower the cost of each bit, the inventor of this application proposed a cascade-gate type semiconductor memory cell as shown in FIG. 1 or 2, for example (U.S. patent application No. 687,687).

The DRAM cell shown in FIG. 1 includes cascade-connected MOS transistors Q1 to Q4 and data storing capacitors C1 to C4 which are each connected at one end to one end of a corresponding one of the MOS transistors Q1 to Q4. Data stored in the capacitors C1 to C4 can be sequentially read out starting from the capacitor C1 which lies near one end of the cascade connection (readout/write-in node N1) and data on the node N1 can be sequentially written into the capacitors C1 to C4 starting from the capacitor C4 which lies in the farthest position from the node N1 by ON/OFF controlling the transistors Q1 to Q4 in a predetermined order.

In the DRAM cell shown in FIG. 2, a MOS transistor Q5 is additionally connected between one end of the transistor Q4 of the DRAM cell of FIG. 1 and a second node N2. Data stored in the capacitors C1 to C4 can be sequentially read out starting from the capacitor C1 which lies near the node N1 and supplied to the node N1 and data on the node N2 can be sequentially written into the capacitors C1 to C4 starting from the capacitor C1 which lies near the node N1 by ON/OFF controlling the transistors Q1 to Q5 in a predetermined order.

In the cascade-gate type memory cell shown in FIG. 1 or 2, plural-bit data can be stored for each bit, and when an array of the above memory cells is constructed, only one contact between the memory cell and the bit line is necessary for a plurality of bits so that an extremely high integration density can be attained in comparison with the conventional DRAM using an array of one-transistor/one-capacitor type cells and the cost for one bit can be significantly lowered.

When the DRAM is constructed by using the above cascade-gate type memory cells, data stored in the cell is read out in a destructive manner and therefore it is always necessary to rewrite data. However, in the above cascade-gate type memory cell, since the order of reading out data from or writing data into the capacitors of one memory cell is previously determined, it is forbidden to rewrite data into the capacitor of a memory cell immediately after stored data is read out from the same capacitor. That is, after data is read out from a capacitor in a memory cell, data cannot be rewritten into the capacitor until data is read out from the remaining capacitors of the same memory cell.

Therefore, when the DRAM is constructed by use of an array of the above cascade-gate type memory cells, it is necessary to provide means capable of sequentially rewriting (or writing) data after a plurality of bits have been time-sequentially read out from the memory cell.

With the above condition taken into consideration, the inventor of this application proposed a semiconductor memory device which includes storing means for temporarily storing plural-bit data time-sequentially read out from the above cascade-gate type memory cells when a DRAM is constructed by use of an array of the above cascade-gate type memory cells and in which the plural-bit data can be sequentially rewritten (or written) after the above readout operation is completed (U.S. patent application No. 721.255).

A difference between the operation speed of a DRAM and that of a microprocessor unit (MPU) continuously becomes larger and the difference between the data transfer speeds of the DRAM and the MPU causes a bottle-neck which gives a large influence on the performance of the whole system. In order to solve this problem, various improvements have been made and a typical one of them is to use a high-speed memory (cache memory) which is connected between the MPU and a main memory in order to compensate for a difference between the cycle time of the MPU and the access time of the main memory and enhance the efficiency of usage of the MPU.

Three types of cache memories are now known: the first one is constructed by a static random access memory (SRAM) which is independent from both of the MPU and DRAM, the second one is constructed by an SRAM called an on-chip cache memory mounted on the MPU or embedded memory (in practice, an MPU having a cache memory may be provided with an SRAM on another chip), and the third one is constructed by SRAM cells mounted on the DRAM chip.

Since the second and third constructions among the above three types of cache memories are compact in size, they may be widely used for high-class devices such as work stations and personal computers. In particular, as the technique of mounting the cache memory constructed by SRAM cells on the DRAM chip in the third construction, the technique of providing SRAM cells for respective columns of a DRAM having one-transistor/one-capacitor cells and using the SRAM cells as a cache memory is disclosed in the article of 1990 Symposium on VLSI Circuits, Digest of Technical Papers, pp 79–80 "A Circuit Design of Intelligent CDDRAM with Automatic Write back Capability". Further, in the above article, the technique of writing back the content of the cache memory provided at the present time into a DRAM cell at a corresponding address when an address to be read out is not present in the cache memory (at the time of missing) and then reading out data from a DRAM cell at an address to be accessed is also described. The above cache mounting type DRAM can be used together with an MPU having a cache memory mounted thereon, and in this case, the cache memory on the DRAM is used as a second cache memory.

In the above-described cache mounting type DRAM, an extremely high average access speed in comparison with a normal DRAM can be attained and a large effect for solving the bottleneck of the system speed can be achieved. However, when compared with the conventional DRAM having one-transistor/one-capacitor cells, in the above DRAM, the chip size will become larger since it is necessary to use SRAM cells and associated circuits. In this respect, in the above article, it is described that the chip size will be 120% of the conventional case.

However, an increase in the chip size raises the cost of one bit and tends to weaken the desire of users to use the above DRAM even if it has an excellent performance.

With the above condition taken into consideration, the inventor of this application proposed a large number of concrete examples of storing means which can be used for temporarily storing data time-sequentially read out from the cascade-gate type memory cells and that the storing means can be used as a cache memory in the U.S. patent application No. 721,255.

SUMMARY OF THE INVENTION

This invention is made to provide the technique of using the storing means as a cache memory, and an object of this invention is to provide a cache mounting type semiconductor memory device which has cascade-gate type memory cells, which can enhance the effective operation speed of the cache memory mounted thereon and which can be formed with a chip size equal to or smaller than that of a standard DRAM using conventional one-transistor/one-capacitor memory cells.

The above object can be attained by a semiconductor memory device comprising a memory cell array having a plurality of cascade-gate type memory cells each of which includes a plurality of cascade-connected MOS transistors and data storing capacitors each connected at one end to one end of a corresponding one of the MOS transistors; storing means provided for columns of the memory cell array, for temporarily storing plural-bit data time-sequentially read out from the memory cell; and controlling means for controlling the storing means to be accessed independently from the memory cell array.

In the semiconductor memory device, it is possible to sequentially read out data stored in the capacitors from the cascade-gate type memory cell and supply the readout data to a bit line, temporarily store the readout data in the storing means and sequentially write the data on the bit line into the respective capacitors of the memory cell. Further, the storing means can be used as a cache memory by accessing the storing means independently from the memory cell array.

Therefore, the access time at the time of missing may become longer in comparison with the case of the conventional cache mounting type DRAM having SRAMs mounted on the respective columns of the DRAM having an array of one-transistor/one-capacitor memory cells, but the access time at the time of hitting becomes equal to or shorter than that of the above conventional DRAM and the average access time can be made equivalent to that of the conventional DRAM. Thus, the effectively high speed (that is, the access speed as an expected value is high) operation can be attained and the chip size thereof can be made equal to or smaller than that of the conventional one-transistor/one-capacitor memory cell type DRAM.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an equivalent circuit diagram showing an example of a cascade-gate type memory cell which is now proposed;

FIG. 2 is an equivalent circuit diagram showing another example of a cascade-gate type memory cell which is now proposed;

FIG. 5 is a circuit diagram showing another example of elements of a register shown in FIG. 3;

FIG. 6 is a circuit diagram showing still another example of elements of the register shown in FIG. 3;

FIGS. 7A and 7B are circuit diagrams showing different concrete examples of the elements of the register shown in FIG. 6;

FIG. 12 is a circuit diagram showing part of a cache mounting type DRAM according to a first embodiment of this invention;

FIG. 16 is a circuit diagram showing part of a cache mounting type DRAM according to a second embodiment of this invention;

FIG. 18 is a circuit diagram showing part of a cache mounting type DRAM according to a fourth embodiment of this invention;

FIG. 19 is a circuit diagram showing another example of the register elements shown in FIG. 18;

FIG. 25 is a circuit diagram showing an example in which the circuit of FIG. 17 is formed with a single ended sense amplifier construction;

FIG. 26 is a circuit diagram showing an example in which the circuit of FIG. 19 is formed with a single ended sense amplifier construction;

FIG. 27 is a circuit diagram showing part of a cache mounting type DRAM according to a fifth embodiment of this invention.

DETAILED DESCRIPTION OF THE PREFERRED EMBODIMENTS

Figure 3:
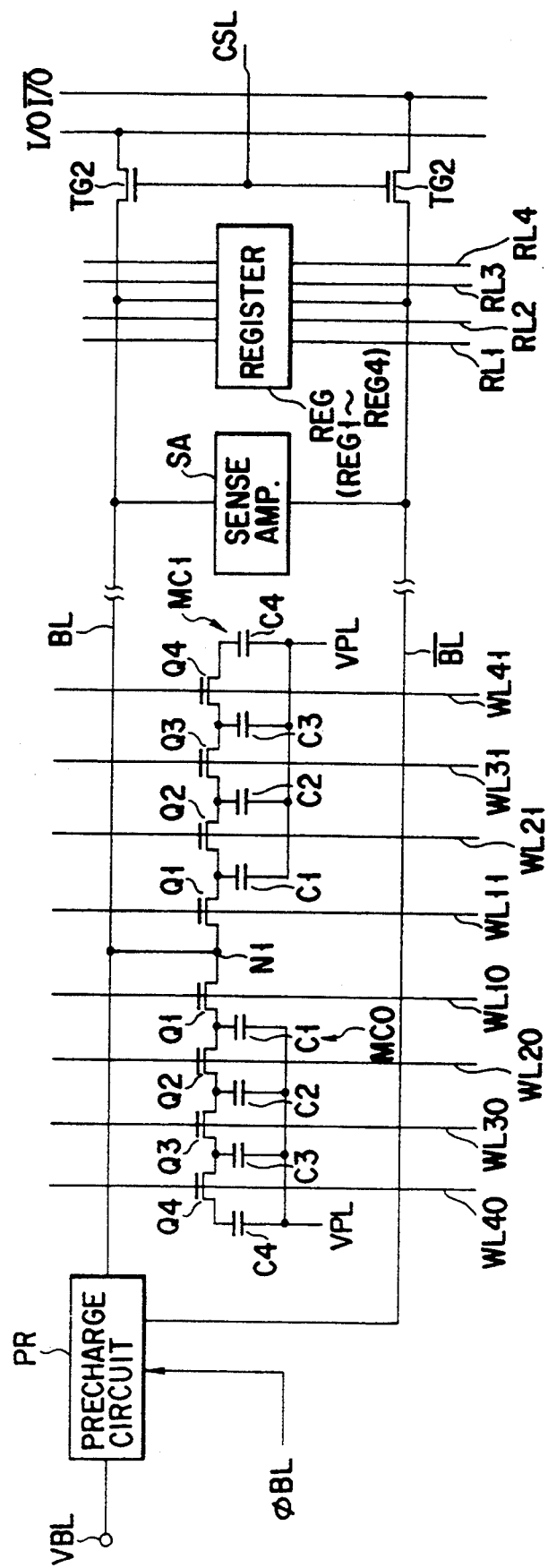
FIG. 3 is a circuit diagram showing part of an example of a DRAM which is now proposed and to which this invention is applied.

There will now be described some embodiments of this invention with reference to the accompanying drawings. In this description, the same reference numerals are used for denoting substantially the same portions throughout the drawings and repetitive explanation for the same portions is omitted.

FIG. 3 is a circuit diagram showing one column of memory cell array extracted from an example of a DRAM which is now proposed and to which this invention is applied. First, the DRAM is schematically explained.

The memory cell array of the DRAM has a plurality of cascade-gate type memory cells which are each constructed as shown in FIG. 1. For brief explanation, two memory cells MC0 and MC1 are typically shown in FIG. 3. (BL, /BL) indicate complementary bit lines, WL10 to WL40 and WL11 to 41 indicate word lines driven by a word line driving circuit (not shown), SA denotes a bit line sense amplifier (for example, latching type amplifier) for sensing the potentials of the bit lines (BL, /BL), REG denotes a register for temporarily storing plural-bit data time-sequentially read out from a selected one of the memory cells, PR denotes a bit line precharge circuit driven by a bit line precharge signal φBL, VBL denotes a bit line precharge power source, TG2 denotes column selection switches controlled by an output CSL of a column decoder circuit (not shown), and (I/O) and/(I/O) are complementary input/output lines.

The memory cell MCi (i=0, 1) includes a cascade gate having a plurality of (in this example, 4) cascade-connected MOS transistors Q1 to Q4 and a plurality of data storing capacitors C1 to C4 which are each connected at one end to that one end of a corresponding one of the MOS transistors Q1 to Q4 which lies farther from a node N1. One end (node N1) of the cascade gate is connected to the bit line BL. The other ends of the respective capacitors C1 to C4 are commonly connected to a capacitor wiring. In this example, the plate electrodes of the capacitors C1 to C4 are connected together and the plate electrodes are applied with a preset capacitor plate potential VPL in the same manner as in the other memory cells.

The gates of the MOS transistors Q1 to Q4 of the memory cell MC0 are respectively connected to the word lines WL10 to WL40, and each of the word lines WL10 to WL40 is commonly connected to the gate of a corresponding one of the transistors Q1 to Q4 in each of the memory cells (not shown) arranged on the same row in the memory cell array. Likewise, the gates of the MOS transistors Q1 to Q4 of the memory cell MC1 are respectively connected to the word lines WL11 to WL41, and each of the word lines WL11 to WL41 is commonly connected to the gate of a corresponding one of the transistors Q1 to Q4 in each of the memory cells (not shown) arranged on the same row in the memory cell array.

The register REG includes storing elements REG1 to REG4 of the same number (4) as that of the capacitors (the number of bits) of the memory cell MCi and the storing elements are controlled by respective control signal lines RL1 to RL4.

Figure 4:
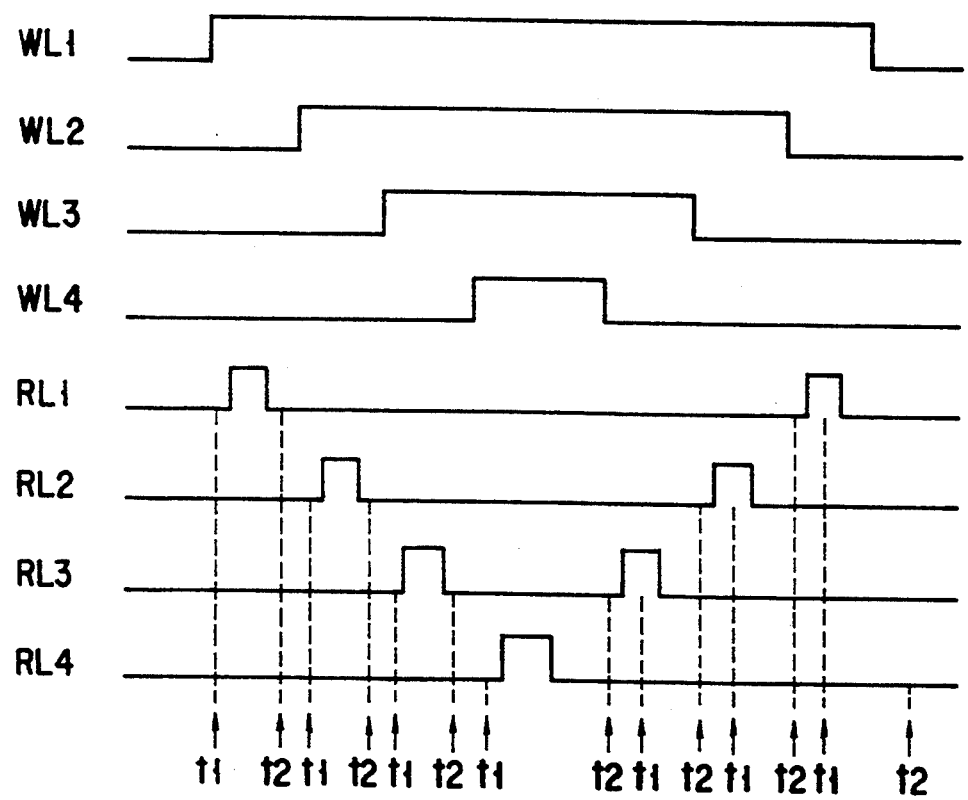
FIG. 4 is a timing waveform diagram for explaining an example of the operation of the DRAM of FIG. 3.

FIG. 4 is a timing waveform diagram for illustrating an example of the operation of the word lines WL1 to WL4, sense amplifier SA and register REG connected to the memory cell MCi shown in FIG. 3. That is, assume that the word lines WL1 to WL4 are ON/OFF controlled at timings shown in FIG. 4 to turn on the transistors Q1 to Q4 in this order and turn off the transistors Q4 to Q1 in this order. Further, assume that the control signal lines RL1 to RL4 are ON/OFF controlled at timings as shown in FIG. 4 to operate the first to fourth elements REG1 to REG4 in this order in the first cycle and operate the elements in an order from the fourth to first elements REG4 to REG1 in the second cycle. In FIG. 4, t1 indicates timings at which the sense amplifier SA is operated, and t2 indicates timings at which the bit line pair (BL,/BL) is precharged/equalized to a preset potential (for example, one half the power source potential).

With the above control, data stored in the capacitors C1 to C4 can be sequentially read out and supplied to the bit line BL in this order starting from the capacitor C1 which lies near the node N1 (the bit line BL to which the memory cell MC is connected) of the memory cell MC, data stored in the capacitors C1 to C4 can be stored into the register REG, and the data on the bit line BL can be sequentially stored into the capacitors C4 to C1 in this order starting from the capacitor C4 which is placed in the farthest position from the node N1.

Thus, data stored in the capacitors C1 to C4 of the memory cell MCi can be read out and supplied to the exterior of the RAM chip when the word lines WL1 to WL4 are driven and the sense amplifier SA is operated. That is, four digital data items (four bits) can be read out in a predetermined order.

The operation of writing data into the DRAM in FIG. 3 may be effected by setting necessary data on the bit lines BL and/BL by means of the data write-in circuit (not shown) at the rewriting timing t1 as explained before. Input data can be written and readout data can be transferred to the output side by selectively connecting an input/output buffer to the column by means of the input/output lines (I/O) and/(I/O). The input/output line pair (I/O) and/(I/O) may be used for both of the input and output, or separately used for the input or the output.

In the register shown in FIG. 5, four 1-bit storing elements (first element REG1 to fourth element REG4) which are each formed of a one-transistor/one-capacitor dynamic memory cell 41 are used. One-side ends of each of the transistors TR1 and TR3 of part (in this example, the first and third elements REG1 and REG3) of the first to fourth elements REG1 to REG4 are connected to one of the bit lines BL and/BL and one-side ends of each of the transistors TR2 and TR4 of the remaining elements (in this example, the second and fourth elements REG2 and REG4) are connected to the other bit line/BL or BL, and the gates of the transistors TR1 to TR4 of the respective elements are connected to the control signal lines RL1 to RL4, respectively, and the other ends of the capacitors RC1 to RC4 of the respective elements are coupled to the same capacitor plate potential VPL.

In the register shown in FIG. 6, first to fourth elements REG1 to REG4 which are each connected to the bit lines BL and/BL and are respectively connected to control signal lines RL1 to RL4 are used.

FIGS. 7A and 7B show respective examples of the construction of each of the storing elements REG1 to REG4 of the register of FIG. 6.

The storing element shown in FIG. 7A includes a static memory cell (SRAM cell) 71 which is constructed by a flip-flop circuit having a resistive load R and two transfer gates. A P-channel MOS transistor may be used instead of the resistive load R.

The storing element shown in FIG. 7B includes a two-transistor/one-capacitor dynamic memory cell 72 having one capacitor connected between two transistors as is disclosed in the article by Y. Ohta, et al "A Novel Memory Cell Architecture for High-Density DRAMs" 1989 Symposium on VLSI Circuits, Digest of Technical Papers, pp 101–102, May 1989.

Figure 8:
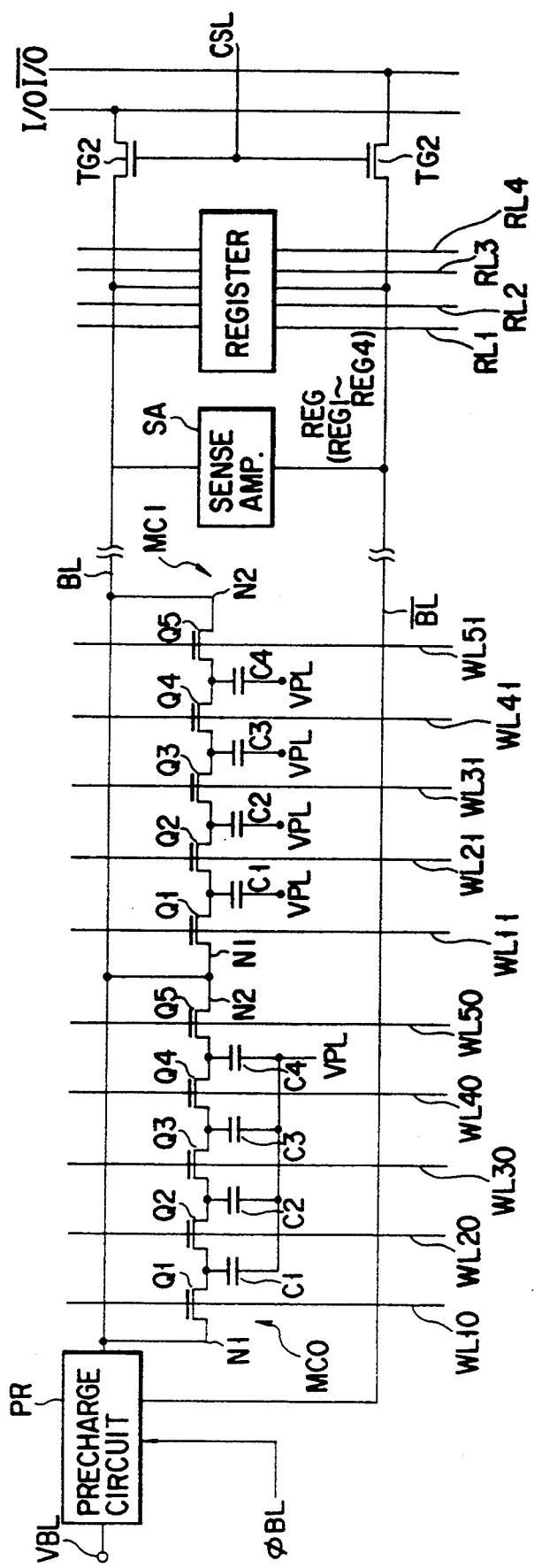
FIG. 8 is a circuit diagram showing part of another example of a DRAM which is now proposed and to which this invention is applied.

FIG. 8 shows one column of a memory cell array of another example of a DRAM which is now proposed and to which this invention is applied.

The DRAM is different from the DRAM of FIG. 3 in that a memory cell array having a plurality of cascade-gate memory cells as shown in FIG. 2 is used. The memory cell MCi (i=0, 1) includes a cascade gate having three or more (in this example five) MOS transistors Q1 to Q5 cascade-connected between the first and second nodes N1 and N2 and a plurality of data storing capacitors C1 to C4 which are connected at one end to respective connection nodes between the adjacent cascade-connected MOS transistors. The first and second nodes N1 and N2 are connected together and connected to the bit line BL. The gates of the transistors Q1 to Q5 of the memory cell M0 are respectively connected to the word lines WL10 to WL50, and each of the word lines WL10 to WL50 is commonly connected to the gate of a corresponding one of the transistors Q1 to Q5 in each of the memory cells (not shown) arranged on the same row in the memory cell array. Likewise, the gates of the MOS transistors Q1 to Q5 of the memory cell MC1 are respectively connected to the word lines WL11 to WL51, and each of the word lines WL11 to WL51 is commonly connected to the gate of a corresponding one of the transistors Q1 to Q5 in each of the memory cells (not shown) arranged on the same row in the memory cell array.

Figure 9:
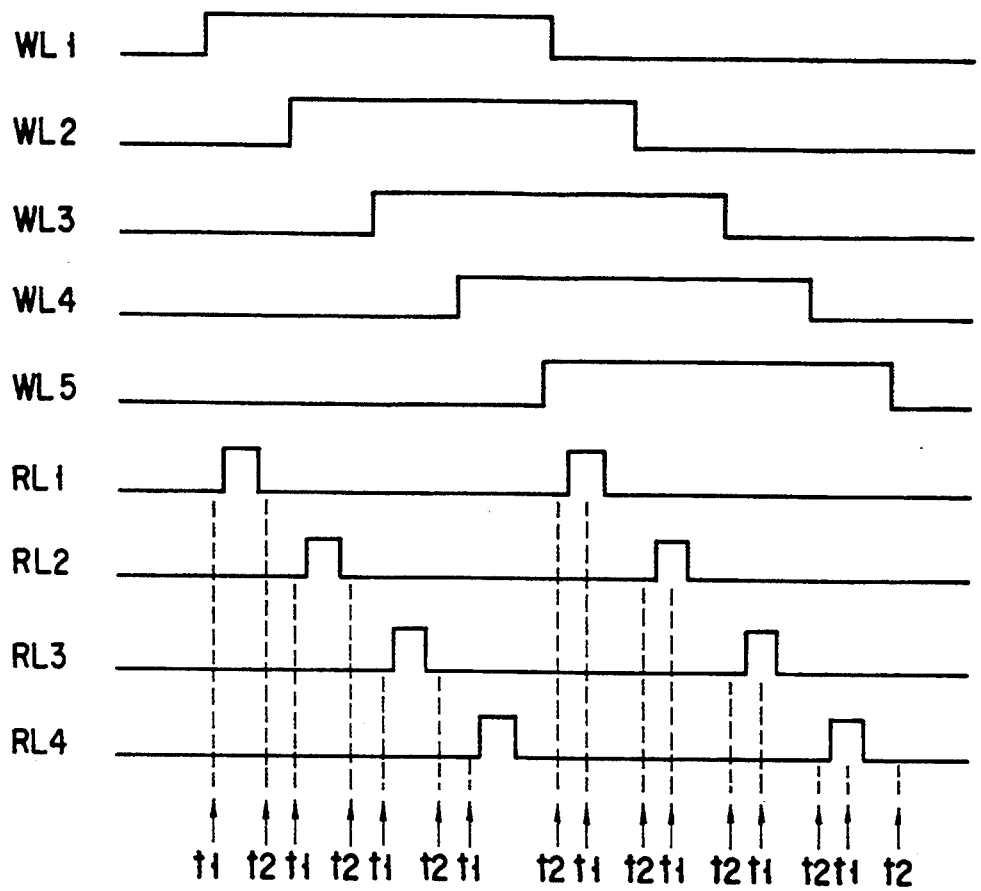
FIG. 9 is a timing waveform diagram for explaining an example of the operation of the DRAM of FIG. 8.

FIG. 9 is a timing waveform diagram showing an example of the operation of the word lines WL1 to WL5, the sense amplifier SA and the register REG connected to one memory cell MCi used in FIG. 8.

Timings t1 and t2 in FIG. 9 have the same meanings as those of the timings shown in FIG. 4. Since the operation is effected in a similar manner to the operation explained with reference to FIG. 4, the detailed explanation therefor is omitted here, but stored data can be read out from the capacitors C1 to C4 in this order and supplied to the bit line BL and stored into the register REG, and data on the bit line BL can be stored into the capacitors C1 to C4 in this order.

Figure 10:
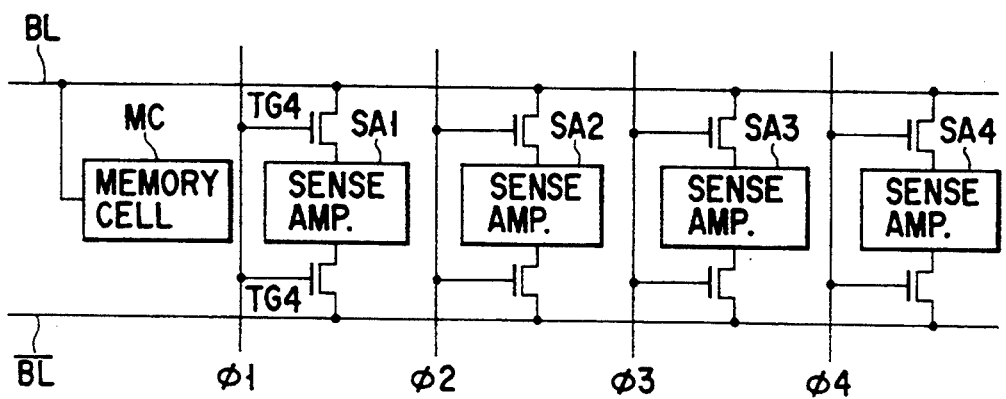
FIG. 10 is a circuit diagram showing part of still another example of a DRAM which is now proposed and to which this invention is applied.

FIG. 10 shows one column of a memory cell array of still another example of a DRAM which is now proposed and to which this invention is applied.

The DRAM includes bit line sense amplifiers SA1 to SA4 of the same number as that of the capacitors used in the memory cell MC and the sense amplifiers SA1 to SA4 are also used as storing means. Each of the four sense amplifiers SA1 to SA4 is connected to the bit lines BL and /BL via respective transfer gates TG4 and TG4, and the transfer gate pairs TG4, TG4 corresponding to the sense amplifiers SA1 to SA4 are respectively ON/OFF controlled by control signals $\phi 1$ to $\phi 4$.

Figure 11:
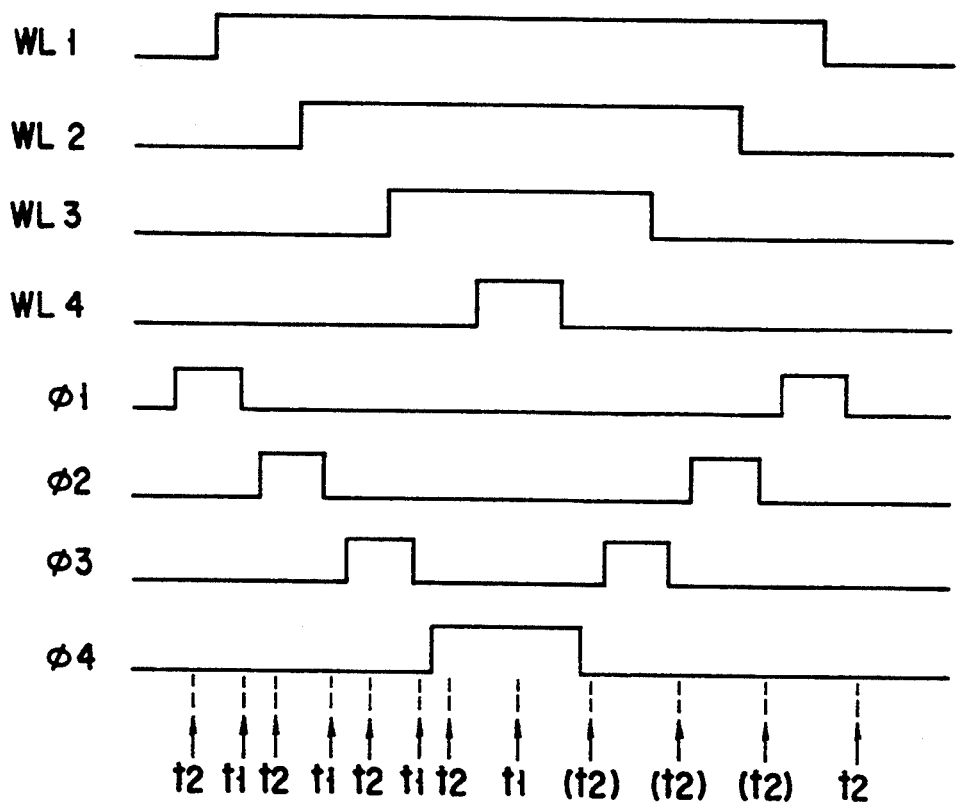
FIG. 11 is a timing waveform diagram for explaining an example of the operation of the DRAM of FIG. 10.

The timing waveforms shown in FIG. 11 show an example of the operation of the word lines WL1 to WL4 and the sense amplifiers SA1 to SA4 connected to one memory cell MC effected when the memory cell MC shown in FIG. 1 is used in the DRAM shown in FIG. 10, for example, and the timings t1 and t2 have the same meanings as those of the timings shown in FIG. 4. That is, for example, the control signal $\phi 1$ is activated, the word line WL1 is activated with the bit line pair (BL, /BL) and the sense amplifier SA1 is set in the precharged state, and data read out from the capacitor C1 of the memory cell MC is supplied to the sense amplifier SA1. Then, after the control signal $\phi 1$ is de-activated, the sense amplifier SA1 is operated to amplify the readout data from the capacitor C1 and latch the data. Data rewriting (or writing) is effected by first precharging the bit line pair (BL,/BL), and then connecting a corresponding sense amplifier SAi to charge or discharge the bit line pair (BL,/BL) to preset potentials and de-activating a corresponding word line WLi. In a case where the sense amplifiers SA1 to SA4 are formed with the CMOS construction and the potentials of the bit line pair (BL,/BL) can be freely set to the VCC power source potential side or VSS power source potential side (grounded potential), for example, the precharging of the bit line pair (BL,/BL) at the time of rewriting (or writing) can be omitted.

In the above DRAM, a differential type amplifier for comparing the bit line potential with the reference potential may be used as the sense amplifier and a rewriting potential can be set on the bit line based on the output of the amplifier by use of a data writing circuit (not shown).

Further, in the above DRAM, it is possible to use a cascade-gate type memory cell disclosed in the U.S. patent application No. 687,687 as another example of the cascade-gate type memory cell. That is, the other ends of the capacitors C1 to C4 of the memory cell MCi may be commonly coupled to the power source potential VCC or ground potential VSS supplied from the exterior. In addition, it is possible to use as the above memory cell a memory cell which employs the technique of subjecting the capacitor plate to the clock operation as is disclosed in IEEE JOURNAL OF SOLID-STATE CIRCUITS, VOL. SC-17, NO. 5, p 872 OCT. 1982 "A Storage-Node-Boosted RAM with World-Line Delay Compensation" by K. Fujishima et al. Likewise, it is also possible to use as the above memory cell a memory cell which employs the technique of connecting transfer gates to both ends of the capacitor as is disclosed in the article of 1989 Symposium of VLSI Circuits, Digest of Tech. Papers, pp 101–102 "A Novel Memory Cell Architecture for High-density DRAMs" FIG. 1(b) by Y. Ohta et al.

FIG. 12 is a circuit diagram showing part of a cache mounting type DRAM according to a first embodiment of this invention. The DRAM is obtained by modifying the DRAM shown in FIG. 3 or 8 to have a function of a cache memory. In FIG. 12, for simplifying the explanation, one column of the memory cell array is shown to include one pair of complementary bit lines (BL,/BL), one memory cell MC, a bit line precharge circuit PR, a bit line sense amplifier SA, a register REG for temporarily storing data time-sequentially read out from the memory cell MC, one pair of complementary digit lines (DL,/DL) to which the sense amplifier SA and register REG are connected, a digit line precharge circuit 11, a pair of first transfer gates (TG1, TG1), and a pair of second transfer gates (TG2, TG2).

The bit line precharge circuit PR is activated by a bit line precharge signal $\phi$BL to precharge the pair of bit lines (BL,/BL) to a bit line precharge potential VBL. The digit line precharge circuit 11 is activated by a digit line precharge signal $\phi$DL to precharge the pair of digit lines (DL,/DL) to a digit line precharge potential VDL. The first transfer gates TG1 are respectively connected between the paired bit lines (BL, /BL) and the paired digit lines (DL,/DL) and the conduction states thereof are controlled by a control signal $\phi$. The second transfer gates TG2 are respectively connected between the paired digit lines (DL,/DL) and the paired input/output lines (I/O),/(I/O) and the conduction states thereof are controlled by a column selection line CSL (output of the column decoder).

The second transfer gate pairs (TG2, TG2) of a plurality of columns are connected to an input/output buffer circuit 12 via the input/output pair (I/O), /(I/O) and the input/output buffer circuit 12 is connected to an input buffer circuit 13 and an output buffer circuit 14.

The memory cell shown in FIG. 1 or 2 may be used as the memory cell MC of FIG. 12 and the register shown in FIG. 5 or 6 may be used as the register REG of FIG. 12.

The DRAM of FIG. 12 is constructed to have the cache memory function. In this case, the register REG is used as a cache memory by providing control means which makes it possible to access the register REG independently from the memory cell MC. As an example of the control means, switching elements (transfer gates TG1) for ON/OFF controlling the electrical connection between the register REG and the paired bit lines BL,/BL are used. A cache memory employs a TAG memory and a data memory, but in this example, all of the register REG is used to function as the data memory (data register) and a TAG memory (TAG register 15) is provided separately from the data register REG. Further, a cache memory address decoder (not shown) for decoding a set address of the cache memory address (set address and TAG address) is provided. In addition, there is provided a comparator 16 as determination means for determining whether or not an address for accessing the cache memory is assigned in the TAG register 15 of the cache memory, that is, whether or not an address is used to read out data stored in the data register REG of the cache memory. Further, an MPU 17 is provided as the control means for the cache memory. The MPU 17 has a function which is generally required to control the cache memory, and particularly in this example, it additionally has a function of accessing an element of the register REG and reading out and outputting data of a corresponding column when data stored in the register REG is to be read out, and writing back the current content of the register REG into a corresponding memory cell MC, then serially reading out data from the memory cell MC which stores necessary data and storing the readout data into the register REG and outputting the same when data which is not stored in the register REG is required.

Figure 13:
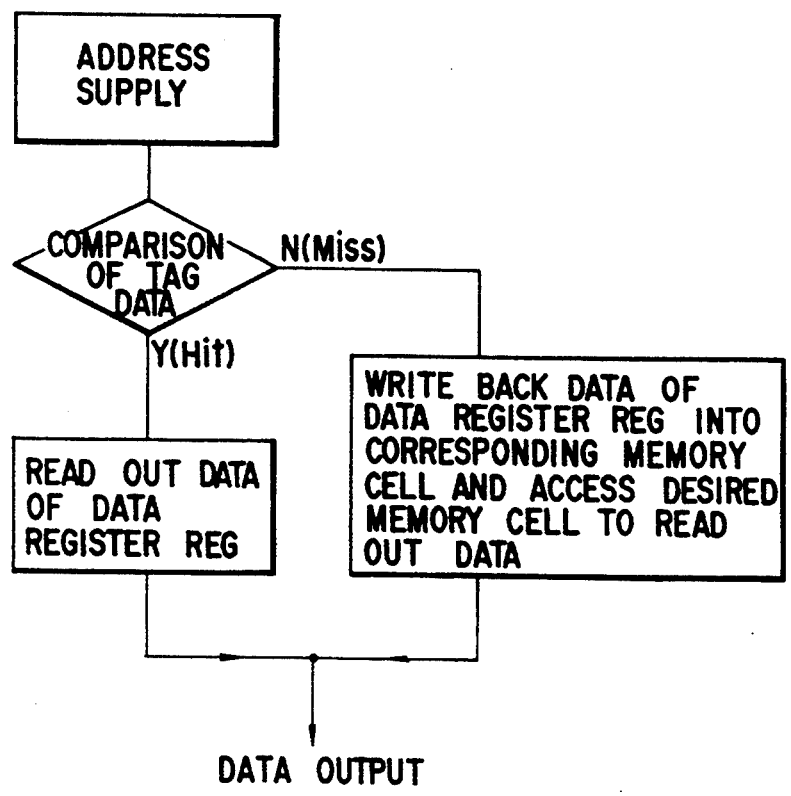
FIG. 13 is a flowchart for schematically illustrating an example of the cache memory controlling operation effected by use of an MPU shown in FIG. 12.

FIG. 13 is a flowchart schematically showing an example of the control operation effected by the MPU 17 for the cache memory of FIG. 12.

The set address for the cache memory supplied from the MPU 17 is input to the cache memory address decoder (not shown). The readout control for the TAG register 15 is effected by an output of the word line driving circuit of the address decoder so as to selectively activate the memory cells (register elements). The readout output from the element of the TAG register 15 is input to the comparator 16 together with a TAG address supplied from the MPU 17 and compared with the TAG address. When the two inputs of the comparator 16 are coincident with each other (at the time of hitting), a coincidence signal is generated as an output signal ACK (Acknowledge) of the comparator 16. Further, the readout output from the element of the data register REG is input to the output buffer circuit 14 via the input/output buffer circuit 12. The output buffer circuit 14 is activated by the coincidence signal and an output of the output buffer circuit 14 is received by the MPU 17. When the two inputs of the comparator 16 are not coincident with each other (at the time of missing), a non-coincidence signal is generated as the output signal ACK of the comparator 16, and the MPU 17 determines that the readout output from the register REG obtained at this time is not correct and accesses a desired memory cell MC. As shown by broken lines in FIG. 12, it is also possible to supply the coincidence/-noncoincidence signal output from the comparator 16 to the input/output buffer circuit 12 and set the input-/output buffer circuit 12 into the activated/de-activated state according to the coincidence/noncoincidence signal.

Next, the access operation effected by the MPU 17 with respect to the cache memory is explained in detail. When an address to be read out is assigned in the TAG register 15 (at the time of hitting), a word line (control signal line RLi) corresponding to a specified data register REG is immediately activated without newly accessing the memory cell MC and data stored in the data register REG is read out and supplied to the pair of digit lines (DL, /DL) which are previously precharged. At this time, the first transfer gates TG1 are set in the OFF state. As a result, it is only necessary to charge or discharge the small parasitic capacitance of the pair of digit lines (DL,/DL) without charging or discharging the large parasitic capacitance of the pair of digit lines (BL,/BL) so that the high-speed operation and reduction in the power consumption can be simultaneously attained. Next, the sense amplifier SA is activated to amplify the signal on the pair of digit lines (DL,/DL). Then, the column selection line CSL on a column to be selected is activated to turn on the second transfer gates TG2 and output data to the pair of input/output lines (I/O),/(I/O). By effecting the above-described operation, one bit is read out from each of the columns at the same time.

The timing at which the column selection line CSL is activated may be set to a point before the sense amplifier SA is activated or even before the control signal line RLi is activated according to the type of a sense amplifier (not shown) for the pair of input/output lines (I/O),/(I/O). Further, when the constituent element of the register REG is an SRAM cell, the sense amplifier SA may not be activated. That is, the input/output line pair (I/O),/(I/O) can be driven by the SRAM cell of the register REG via the second transfer gates TG2 simply by activating the control signal line RLi to select the register REG. Further, the non-destructive readout can be effected for the SRAM cell and the operation of the sense amplifier for data restoration becomes unnecessary.

In contrast, when an address to be read out is not assigned in the register REG (at the time of missing), the operation must be started from access to the memory cell MC. However, in this case, since the content of the register REG is updated, the content of the register REG is previously written back into a memory cell MC whose address is now assigned in the register REG. The operation is exactly the same as the restoring operation. Next, 4-bit data of the memory cell MC at an address to be read out is sequentially read out. In this process, the content of the register REG is updated.

In the case of the DRAM of FIG. 12, the possibility that a bit which must be written back at the time of missing may be only one bit which is an i-th bit among the four bits to be time-sequentially read out is high. In this case, a desired purpose can be attained by activating the column selection line CSL only when i-th data is amplified by the sense amplifier SA (that is, controlling the output of the column decoder by use of a row address indicating the digit position of the bit among the four bits). Of course, it is necessary to restore the four bits of the memory cell in order according to the content stored into the register REG.

In the DRAM of FIG. 12, when 4-bit data is sequentially read out from the memory cell MCi in a destructive manner, it is only necessary to cause a signal from the memory cell MC to be transmitted to the sense amplifier SA via the bit line BL in order to store the data into the register REG and it is not necessary to charge or discharge the bit line pair BL,/BL with the full amplitude of the power source voltage. It is necessary to charge or discharge the bit line pair BL, /BL with the full amplitude of the power source voltage at the time of data restoration. Therefore, when data is read out from the memory cell MC, the current consumption can be reduced by setting the first transfer gates TG1 in the OFF state after the signal from the memory cell MC has reached the sense amplifier SA so as not to charge or discharge the bit line pair BL, /BL with the full amplitude of the power source voltage at the time of readout (not at the time of data restoration).

Figure 14:
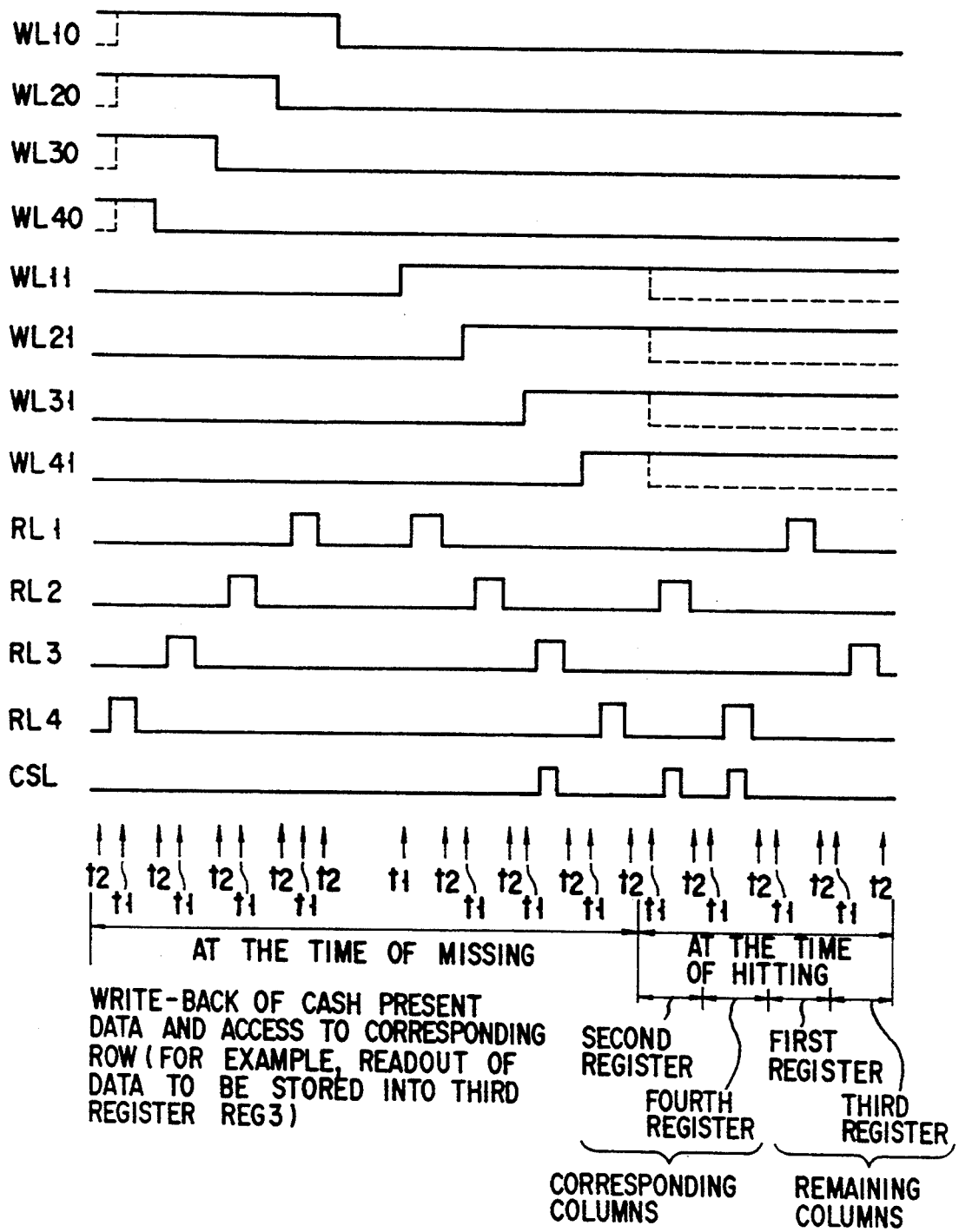
FIG. 14 is a timing waveform diagram for explaining an example of the operation of the DRAM of FIG. 12.

Next, another example of the operation (including the write-back operation at the time of missing) of the DRAM shown in FIG. 12 is explained with reference to the timing waveforms of FIG. 14. In this operation, the access to the cache memory (register REG) is effected with the word line of a corresponding memory cell MC kept ON state and restoration of data into the memory cell MC is effected in the form of write-back of the cache memory. It is also possible to effect the access to the cache memory with the word line of a corresponding memory cell MC kept OFF state, but in this case, the word line is operated as shown by broken lines in FIG. 14. That is, when the write-back is effected at the time of missing, the operation of setting the word lines WL10 to WL40 of a memory cell MC0 corresponding to the cash memory into the ON state is first effected (simultaneously or time-sequentially). Then, the control signal line RL4 is de-activated to transmit the content of the fourth register element REG4 of the register REG to the digit line DL, the sense amplifier SA is activated to set potentials of the bit lines BL to the write-back level which is to be set to the memory cell MC0, and the word line WL40 is set OFF state. The same operation is repeatedly effected to sequentially set OFF state the word lines WL30, WL20 and WL10, and then the write-back operation is completed. After this, the word lines WL11 to WL41 corresponding to a row to be selected are sequentially set ON state, the content of the memory cell MC is transferred to the register REG, and after completion of the transfer, the word lines WL11 to WL41 are set OFF state (simultaneously or time-sequentially). In the readout operation of the register REG at the time of hitting, the operation of the sense amplifier SA can be omitted when each element of the register REG is formed of an SRAM.

Like an ordinary DRAM, in the memory cell of the above-described DRAM, a periodic refresh operation is necessary. In the refresh operation, an operation similar to that effected at the time of missing is necessary, and the operation is started by first writing back the content of the register REG to a corresponding memory cell MC. Next, data is sequentially read out from a memory cell on a corresponding row (for four word lines) to be refreshed and is restored. At this time, unlike the ordinary readout operation, the column selection line CSL is not necessarily activated. At the end of the refreshing operation, data is read out from the memory cell MC to which the content of the register REG has been first written back and the the content of the register REG is restored to the initial state set before the refreshing operation is started.

According to the DRAM of FIG. 12, each of the registers REG which are provided for the respective columns of the array of cascade-gate type memory cells MC and temporarily store data time-sequentially read out from the memory cells MC is accessed independently from the array of memory cells MC and used as a cache memory.

Therefore, the access time thereof at the time of missing may be made longer in comparison with that of the conventional cache mounting type DRAM having SRAMs provided for respective columns of a DRAM having an array of one-transistor/one-capacitor memory cells, but the access time thereof at the time of hitting can be made equivalent to or shorter than that of the conventional DRAM and the average access time thereof can be made equivalent to that of the conventional DRAM. Further, the chip size thereof may be made equivalent to or smaller than that of the conventional one-transistor/one-capacitor type DRAM.

with the above cache memory, the limitation that the cascade-gate type memory cell MC will have the serial accessibility can be significantly compensated.

In the DRAM of FIG. 12, the TAG register 15 is provided separately from the register REG, but the TAG register 15 may be provided in the register REG. Further, in the DRAM of FIG. 12, the embedded memory in which the DRAM and the MPU 17 are formed on the same chip is used, but the DRAM and the MPU 17 may be formed on different chips.

Figure 15:
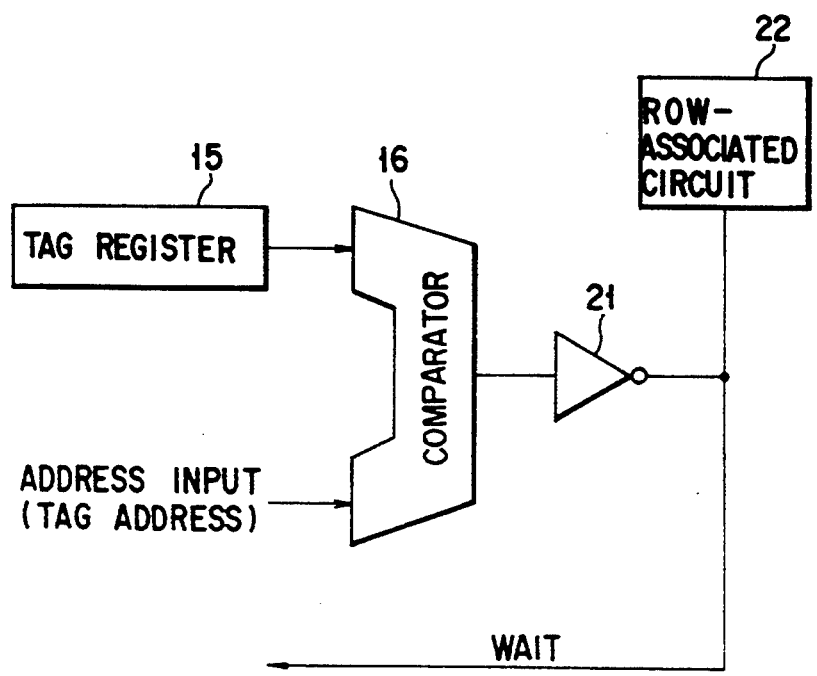
FIG. 15 is a circuit diagram showing a modification of a comparator shown in FIG. 12.

FIG. 15 is a circuit diagram showing a modification of the comparator 16 in FIG. 12 and an example of control effected by use of an output thereof. In this circuit, when two inputs to the comparator 16 are not coincident with each other (at the time of missing), a noncoincidence output of the comparator 16 is output as a wait signal WAIT to the MPU 17 via a buffer circuit 21 so as to set the MPU 17 into the waiting state and the wait signal WAIT is used to initialize a sequence of operations of restoration, precharge and selection of a new row effected by means of a row-associated circuit 22 of the DRAM. When data read out from a desired memory cell is finally stored into the data register REG and is made ready to be output, output of the wait signal WAIT is interrupted to release the waiting state of the MPU 17 so that the MPU 17 can be permitted to receive data from the DRAM.

FIG. 16 is a circuit diagram showing part of a cache mounting type DRAM according to a second embodiment of this invention. The DRAM is similar to the DRAM shown in FIG. 12 except that an SRAM cell is used for each element of the register REG, third transfer gates TG3 whose conduction state is controlled by a control signal line $\phi a$ are connected between the sense amplifier SA and the register REG, and a pair of input/output lines (I/O), /(I/O) are driven only by means of the SRAM cells (the elements of the register) by turning off the third transfer gates TG3 at the time of hitting. In this case, the third transfer gates TG3 are used as a control means for controlling the register REG to be accessed independently from the memory cell MC. When the third transfer gates TG3 are used, the first transfer gates TG1 may be omitted, but the first transfer gates TG1 are preferably used from the viewpoint of suppressing a current when data is read out from the memory cell and the reason therefor is described in the explanation made for the DRAM shown in FIG. 12.

Figure 17:
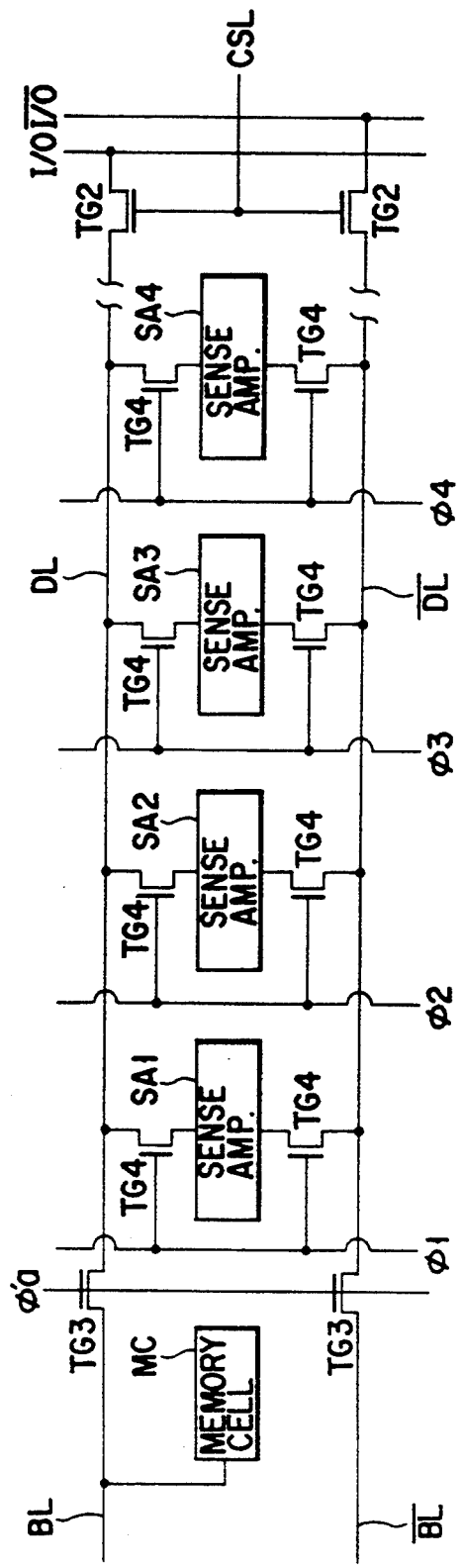
FIG. 17 is a circuit diagram showing part of a cache mounting type DRAM according to a third embodiment of this invention.

FIG. 17 is a circuit diagram showing part of a cache mounting type DRAM according to a third embodiment of this invention. The DRAM is similar to the DRAM shown in FIG. 16 except that each element REGi (i=1 to 4) of the register is replaced by a sense amplifier SAi and is also used as the sense amplifier SA and the first transfer gates TG1 are omitted. Each of the bit line sense amplifiers SA1 to SA4 is connected to a pair of bit lines BL,/BL via a corresponding pair of fourth transfer gates TG4, TG4 and the conduction states of the fourth transfer gate pairs TG4 respectively provided for the sense amplifiers SA1 to SA4 are controlled by control signal lines $\phi 1$ to $\phi 4$, respectively. In the above DRAM, the operation at the time of hitting is effected in the same manner as the operation of the DRAM shown in FIG. 16.

FIG. 18 is a circuit diagram showing part of a cache mounting type DRAM according to a fourth embodiment of this invention. The DRAM is similar to the DRAM shown in FIG. 12 except that an SRAM cell is used for each element REGi (i =1, 2, 3, 4) of the register, each pair of fourth transfer gates TG4 whose gate is controlled by a corresponding control signal line RLi (i=1, 2, 3, 4) are connected between a corresponding element REGi and a pair of digit lines DL,/DL, and each pair of the second transfer gates TG2 whose gate is controlled by a column selection line CSL are connected between a corresponding element REGi and a pair of input/output lines (I/O)i, /(I/O)i.

In the above DRAM, four bits can be simultaneously read out from one column. In this case, the access speed at the time of hitting can be further enhanced by keeping the control signal line RLi de-activated at the time of hitting and immediately activating the column selection line CSL of a corresponding column. Further, since the fourth transfer gates TG4 whose gate is controlled by the control signal line RLi have the same function as the third transfer gates TG3 shown in FIG. 16, the third transfer gates TG3 can be omitted.

FIG. 19 is a circuit diagram showing a modification of the DRAM shown in FIG. 18. The DRAM is similar to the DRAM of FIG. 18 except that a sense amplifier SAi is used as a corresponding element REGi of the register and only one of the elements is shown. Like the DRAM of FIG. 18, in this DRAM, four bits can be simultaneously read out from one column, and since the fourth transfer gates TG4 have the same function as the third transfer gates TG3 described before, the third transfer gates TG3 can be omitted.

In each of the above embodiments, the layout is shown in the drawings as if the memory cell array structure is the folded bit line structure, but the cell array structure is not necessarily limited to the folded bit line structure and may be the open bit line structure.

Further, in the DRAM of this invention, a construction in which only the bit line BL is directly connected to or indirectly connected via the transfer gate to one of the input nodes of the sense amplifier SA (so-called single-ended sense amplifier construction) may be used and examples thereof are shown in FIGS. 20 to 26.

Figure 20:
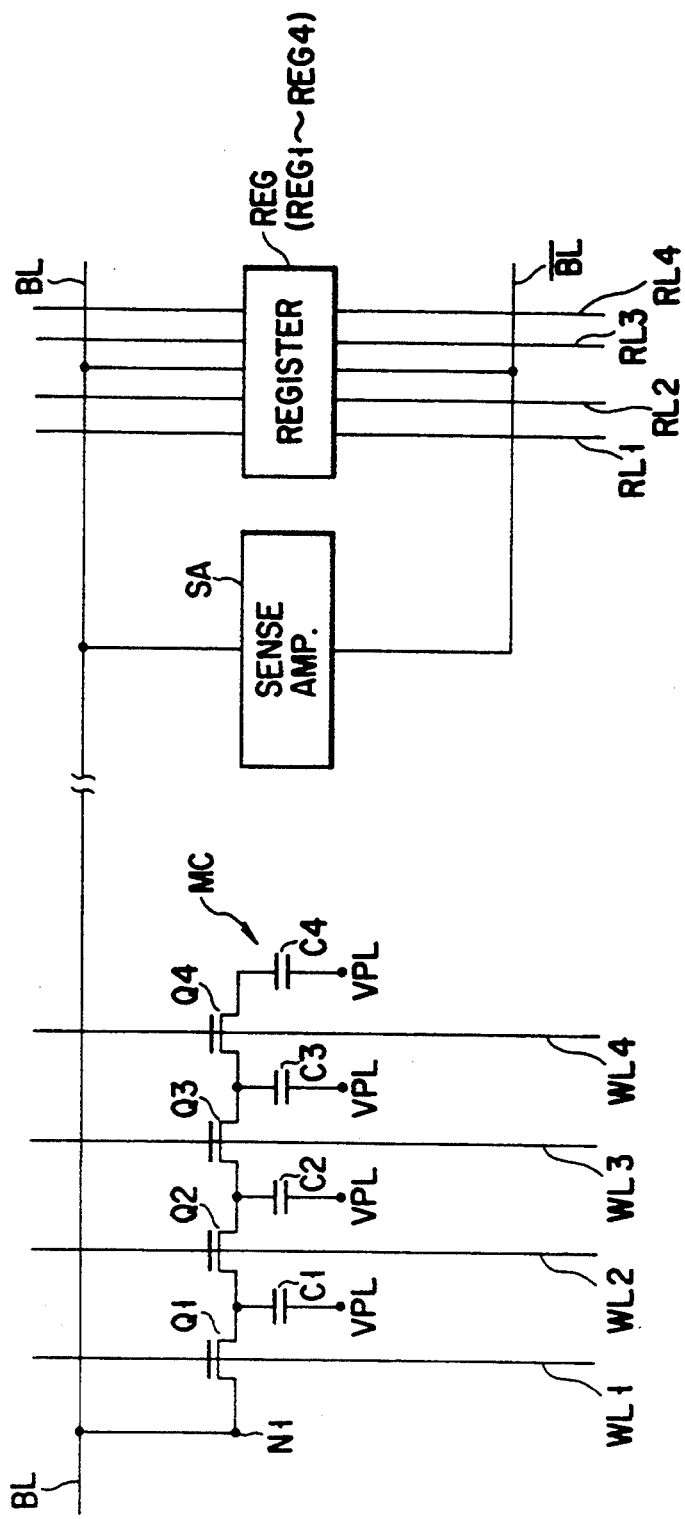
FIG. 20 is a circuit diagram showing an example in which the circuit of FIG. 3 is formed with a single ended sense amplifier construction.

FIG. 20 shows a case wherein the circuit of FIG. 3 is formed with the single ended sense amplifier construction.

Figure 21:
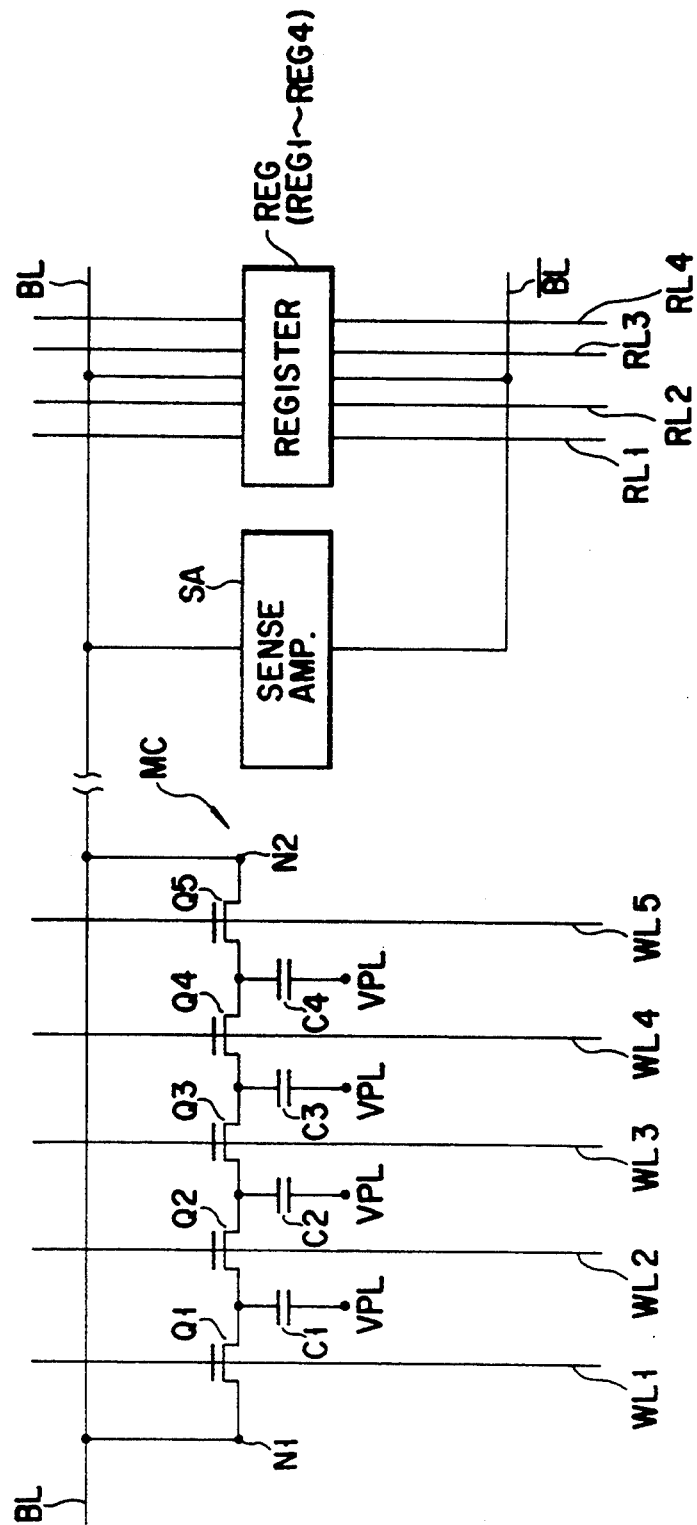
FIG. 21 is a circuit diagram showing an example in which the circuit of FIG. 8 is formed with a single ended sense amplifier construction.

FIG. 21 shows a case wherein the circuit of FIG. 8 is formed with the single ended sense amplifier construction.

Figure 22:
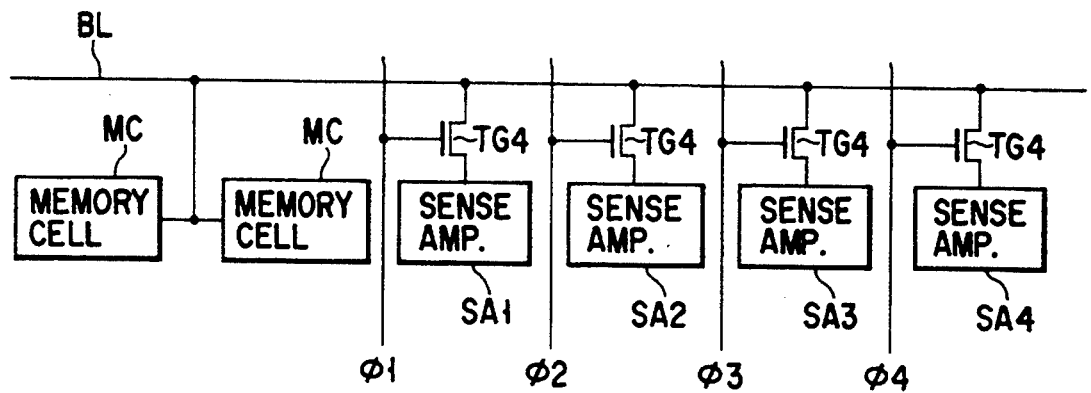
FIG. 22 is a circuit diagram showing an example in which the circuit of FIG. 10 is formed with a single ended sense amplifier construction.

FIG. 22 shows a case wherein the circuit of FIG. 10 is formed with the single ended sense amplifier construction.

Figure 23:
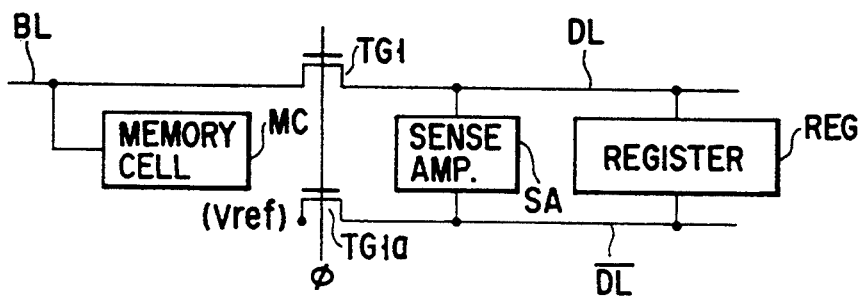
FIG. 23 is a circuit diagram showing an example in which the circuit of FIG. 12 is formed with a single ended sense amplifier construction.

FIG. 23 shows a case wherein the circuit of FIG. 12 is formed with the single ended sense amplifier construction. In this case, a transfer gate TG1a connected to one end of a digit line/DL is provided for compensating for the influence by the transfer gate TG1 connected between the bit line BL and the sense amplifier SA, but it is not necessarily provided and can be omitted. Also, it is possible to apply a comparison reference potential vref to the sense amplifier SA via the transfer gate TG1a.

Figure 24:
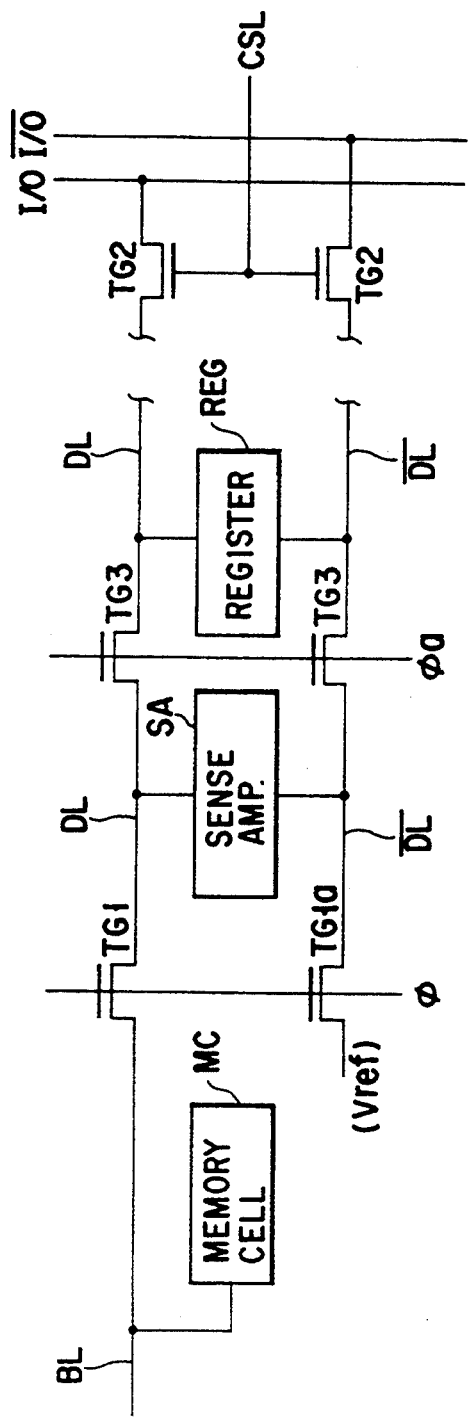
FIG. 24 is a circuit diagram showing an example in which the circuit of FIG. 16 is formed with a single ended sense amplifier construction.

FIG. 24 shows a case wherein the circuit of FIG. 16 is formed with the single ended sense amplifier construction. In this case, a transfer gate TG1a is the same as the transfer gate TG1a of FIG. 23.

FIG. 25 shows a case wherein the circuit of FIG. 17 is formed with the single ended sense amplifier construction. In this case, a transfer gate TG3a connected to one end of a digit line/DL is provided for compensating for the influence by the transfer gate TG3 connected between the bit line BL and the sense amplifier SA, but it is not necessarily provided and can be omitted. Also, it is possible to apply a comparison reference potential vref for the sense amplifier SAi to one end of the transfer gate TG3a.

FIG. 26 shows a case wherein the circuit of FIG. 19 is formed with the single ended sense amplifier construction. In this case, a transfer gate TG4a connected to one input terminal of a sense amplifier SAi is provided for compensating for the influence by the transfer gate TG4 connected between the bit line BL and the other input terminal of the sense amplifier SAi, but it is not necessarily provided and can be omitted. Also, it is possible to apply a comparison reference potential Vref to the sense amplifier SAi via the transfer gate TG4a.

Further, the DRAM of this invention may use a so-called shared sense amplifier system in a case wherein a connection means such as a transfer gate is connected between the bit line BL and the sense amplifier SA.

FIG. 27 is a circuit diagram showing part of a cache mounting type DRAM according to a fifth embodiment of this invention. The DRAM is obtained by modifying the DRAM shown in FIG. 12 to have the single ended sense amplifier construction and use the shared sense amplifier system. That is, a plurality of bit lines BLa to BLd and a plurality of transfer gates TGa to TGd commonly use a single sense amplifier SA and the transfer gates TGa to TGd are controlled to permit only one of the bit lines BLa to BLd to be selectively connected to the sense amplifier SA.

Figure 28:
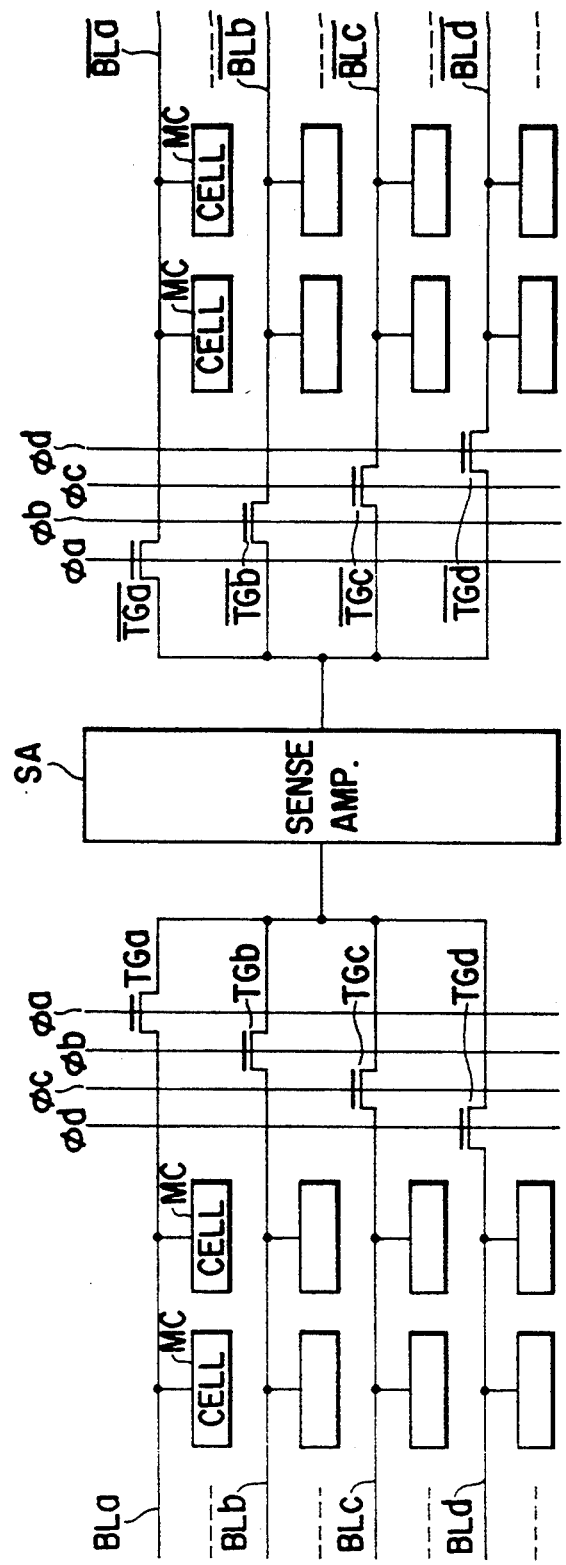
FIG. 28 is a circuit diagram showing part of a cache mounting type DRAM according to a sixth embodiment of this invention.

FIG. 28 is a circuit diagram showing part of a cache mounting type DRAM according to a sixth embodiment of this invention. The DRAM is obtained by modifying the DRAM shown in FIG. 12 to have a cell array construction of open bit line configuration and use the shared sense amplifier system. That is, a plurality of pairs of bit lines (BLa,/BLa) to (BLd,/BLd) and a plurality of pairs of transfer gates (TGa,/TGa) to (TGd,/TGd) commonly use a single sense amplifier SA and the transfer gate pairs (TGa,/TGa) to (TGd,/TGd) are controlled to permit only one of the pairs of bit lines (BLa,/BLa) to (BLd,/BLd) to be selectively connected to the sense amplifier SA.

This invention is not limited by the embodiments described in the specification with reference to the accompanying drawings. This invention can be variously modified without departing from the technical scope of this invention and within the technical scope defined by the following claims.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device, comprising:
a memory cell array having a plurality of memory cell units arranged in rows and columns, each memory cell unit comprising:
a first dam node;
a first MOS transistor having first and second terminals, the first terminal of said first MOS transistor being connected to said first dam node,
a second MOS transistor having first and second terminals, the first terminal of said second MOS transistor being connected to the second terminal of said first MOS transistor, and
first and second data storage capacitors respectively connected to the second terminals of said first and second MOS transistors;
word lines respectively connected to gates of the first and second MOS transistors of said memory cell units for supplying signals to control ON/OFF switching of the first and second MOS transistors of said dynamic memory cell units;
bit lines each connected to the first data nodes of the memory cell units in a respective corresponding column of said memory cell array;
storing circuits, each respective storing circuit having an input terminal coupled to at least two corresponding ones of said bit lines and including first and second single end type sense amplifiers for storing data time-sequentially supplied to said input terminal from the dynamic memory cell units connected to the at least two corresponding bit lines; and
controlling means for controlling said storing circuits to be accessed independently of said memory cell array, said controlling means including first transfer gates respectively connected between said bit lines and the input terminals of said storing circuits, said first transfer gates responsive to first control signals for selectively connecting said respective storing circuits to only one of the at least two corresponding bit lines at a time.

2. A semiconductor memory device according to claim 1, further comprising:
control means for controlling said sense amplifiers to be accessed independently of said memory cell array, said control means for controlling said sense amplifiers including second transfer gates controlled by second control signals connected between said first transfer gates and said sense amplifiers; and
third transfer gates controlled by third control signals connected between said sense amplifiers and input-/output lines.

3. A semiconductor memory device according to claim 2, wherein said third transfer gates are controlled by a common control signal line to permit a plurality of bits to be simultaneously read out from a selected column.

4. A semiconductor memory device, comprising:
a memory cell array having a plurality of memory cell units, each memory cell unit including:
a first dam node;
a first MOS transistor having first and second terminals, the first terminal of said first MOS transistor being connected to said first data node,
a second MOS transistor having first and second terminals, the first terminal of said second MOS transistor being connected to the second terminal of said first MOS transistor, and
first and second data storage capacitors respectively connected to the second terminals of said first and second MOS transistors;
word lines respectively connected to gates of the first and second MOS transistors of said memory cell units for supplying signals to control ON/OFF switching of said first and second MOS transistors;
first bit lines connected to the first data nodes of first ones of said memory cell units;
second complementary bit lines connected to the first data nodes of second ones of said memory cell units;
storing circuits, each respective storing circuit having a first input terminal coupled to at least two corresponding ones of said first bit lines and a second input terminal coupled to at least two corresponding ones of said second bit lines, each respective storing circuit including first and second sense amplifiers for storing complementary data time-sequentially supplied to said first and second input terminals from the dynamic memory cell units connected to the at least two corresponding first bit lines and from the dynamic memory cells connected to the at least two corresponding second bit lines, respectively; and controlling means for controlling said storing circuits to be accessed independently of said memory cell array, said controlling means including first transfer gates respectively connected between said first bit lines and said first input terminals of said storing circuits and between said second bit lines and said second input terminals of said storing circuits, said first transfer gates responsive to first control signals for selectively connecting said respective storing circuits to (1) only one of the at least two corresponding first bit lines and (2) only one of the at least two corresponding second bit lines at a time.

5. A semiconductor memory device according to claim 4, further comprising:

control means for controlling said sense amplifiers to be accessed independently of said memory cell array, said control means for controlling said sense amplifiers including second transfer gates controlled by second control signals connected between said first transfer gates and said sense amplifiers; and third transfer gates controlled by third control signals connected between said sense amplifiers and input-/output lines.

6. A semiconductor memory device according to claim 5, wherein said third transfer gates are controlled by a common control signal line to permit a plurality of bits to be simultaneously read out from a selected column.

* * * * *